United States Patent
Kwon et al.

(10) Patent No.: US 10,504,606 B2
(45) Date of Patent: Dec. 10, 2019

(54) MEMORY DEVICE AND OPERATING METHOD THEREOF

(71) Applicant: SK hynix Inc., Gyeonggi-do (KR)

(72) Inventors: Kyoung Han Kwon, Seoul (KR); Seung Wan Chai, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 89 days.

(21) Appl. No.: 15/859,851

(22) Filed: Jan. 2, 2018

(65) Prior Publication Data
US 2018/0374555 A1    Dec. 27, 2018

(30) Foreign Application Priority Data

Jun. 23, 2017   (KR) .................. 10-2017-0079944

(51) Int. Cl.
*G11C 29/38* (2006.01)
*G11C 29/12* (2006.01)
*G11C 29/36* (2006.01)

(52) U.S. Cl.
CPC ........ *G11C 29/38* (2013.01); *G11C 29/12015* (2013.01); *G11C 29/36* (2013.01); *G11C 2029/3602* (2013.01)

(58) Field of Classification Search
None
See application file for complete search history.

(56) References Cited

U.S. PATENT DOCUMENTS

| | | | | |
|---|---|---|---|---|
| 5,617,531 A | * | 4/1997 | Crouch | G11C 29/006 714/10 |
| 6,246,618 B1 | * | 6/2001 | Yamamoto | G11C 29/14 365/189.02 |
| 2005/0018486 A1 | * | 1/2005 | Kawai | G11C 16/3468 365/185.21 |
| 2010/0322022 A1 | * | 12/2010 | Shinozaki | G11C 7/22 365/194 |
| 2012/0155172 A1 | * | 6/2012 | Watanabe | G11C 11/005 365/185.09 |
| 2017/0032849 A1 | * | 2/2017 | Park | G11C 29/26 |

FOREIGN PATENT DOCUMENTS

KR    1020090005918    1/2009

OTHER PUBLICATIONS

Kim, C. et al., A 512Gb 3b/cell 64-Stacked WL 3D V-NAND Flash Memory, IEEE, pp. 202-204, 2017.

\* cited by examiner

*Primary Examiner* — Douglas King
(74) *Attorney, Agent, or Firm* — IP & T Group LLP

(57) ABSTRACT

A memory device that supports a built-in self-test (BIST) operation includes: a plurality of memory cells; a page buffer group including page buffer circuits respectively coupled to the plurality of memory cells through bit lines; a built-in self-test (BIST) controller configured to generate pattern data to be stored in the page buffer circuits and reference data to be compared with sensed data obtained from the page buffer circuits, and to compare the reference data with the sensed data; and an input/output control circuit configured to input the pattern data to the page buffer circuits and to transfer the sensed data from the page buffer circuits to the BIST controller.

16 Claims, 20 Drawing Sheets

FIG. 8

| CLK | IO7 | IO6 | IO5 | IO4 | IO3 | IO2 | IO1 | IO0 | HEXADECIMAL |
|---|---|---|---|---|---|---|---|---|---|
| 1 | 1 | 1 | 1 | 1 | 0 | 0 | 0 | 0 | 0 |
| 2 | 1 | 1 | 0 | 1 | 0 | 0 | 1 | 0 | 2 |
| 3 | 1 | 0 | 1 | 1 | 0 | 1 | 0 | 0 | 4 |
| 4 | 1 | 0 | 0 | 1 | 1 | 0 | 1 | 0 | 6 |
| 5 | 0 | 1 | 1 | 1 | 1 | 0 | 0 | 0 | 8 |
| 6 | 0 | 1 | 0 | 1 | 1 | 1 | 1 | 0 | A |
| 7 | 0 | 0 | 1 | 1 | 1 | 1 | 0 | 0 | C |
| 8 | 0 | 0 | 0 | 1 | 1 | 1 | 1 | 0 | E |

| CLK | IO7 | IO6 | IO5 | IO4 | IO3 | IO2 | IO1 | IO0 | HEXADECIMAL |
|---|---|---|---|---|---|---|---|---|---|
| 1 | 1 | 1 | 1 | 0 | 0 | 0 | 0 | 1 | 1 |
| 2 | 1 | 1 | 0 | 0 | 0 | 0 | 1 | 1 | 3 |
| 3 | 1 | 0 | 1 | 0 | 0 | 1 | 0 | 1 | 5 |
| 4 | 1 | 0 | 0 | 0 | 1 | 0 | 1 | 1 | 7 |
| 5 | 0 | 1 | 1 | 0 | 1 | 0 | 0 | 1 | 9 |
| 6 | 0 | 1 | 0 | 0 | 1 | 1 | 1 | 1 | B |
| 7 | 0 | 0 | 1 | 0 | 1 | 1 | 0 | 1 | D |
| 8 | 0 | 0 | 0 | 0 | 1 | 1 | 1 | 1 | F | ately coupled to the plurality of memory cells
MEMORY DEVICE AND OPERATING METHOD THEREOF

CROSS-REFERENCE TO RELATED APPLICATION

The present application claims priority under 35 U.S.C. § 119(a) to Korean patent application number 10-2017-0079944 filed on Jun. 23, 2017, the entire disclosure of which is herein incorporated by reference.

BACKGROUND

Field of Invention

An aspect of the present disclosure relates to an electronic device, more particularly, to a memory device and an operating method thereof.

Description of Related Art

A memory device is a storage device implemented using a semiconductor such as silicon (Si), germanium (Ge), gallium arsenide (GaAs), or indium phosphide (InP). The memory device is generally classified into a volatile memory device and a nonvolatile memory device.

The volatile memory is a memory device which loses stored data when a power supply is cut off. Examples of the volatile memory include a static random access memory (SRAM), a dynamic RAM (DRAM), a synchronous DRAM (SDRAM), and the like. The nonvolatile memory is a memory device which retains stored data even when a power supply is cut off. Examples of the nonvolatile memory include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. The flash memory is generally classified into a NOR type flash memory and a NAND type flash memory.

SUMMARY

Embodiments provide a memory device that supports a built-in self-test (BIST) operation and an operating method for the memory device.

According to an aspect of the present disclosure, there is provided a memory device including: a plurality of memory cells; a page buffer group including page buffer circuits respectively coupled to the plurality of memory cells through bit lines; a built-in self-test (BIST) controller configured to generate pattern data to be stored in the page buffer circuits and reference data to be compared with sensed data obtained from the page buffer circuits, and to compare the reference data with the sensed data; and an input/output control circuit configured to input the pattern data to the page buffer circuits and to transfer the sensed data from the page buffer circuits to the BIST controller.

According to an aspect of the present disclosure, there is provided a memory device including a memory cell array including a plurality of memory banks, the memory device including: a memory device having a memory cell array including a plurality of memory banks, the memory device comprising: a page buffer group including a plurality of page buffer circuits respectively coupled to the plurality of memory banks, the plurality of page buffer circuits storing data to be stored in the plurality of memory banks and storing data read from the plurality of memory banks; and a BIST controller configured to test a data path of the memory device by performing a BIST write operation of storing data in the plurality of page buffer circuits and performing a BIST read operation of reading data stored in the page buffer circuits.

According to an aspect of the present disclosure, there is provided a method for operating a memory device, the method including: receiving a write command and a write address from an external device; generating pattern data to be stored In a page buffer circuit corresponding to the write address in response to the write command; storing the pattern data in the page buffer circuit corresponding to the write address; receiving a read command and a read address from the external device; generating the pattern data in response to the read command; and comparing the pattern data with sensed data obtained from the page buffer circuit.

BRIEF DESCRIPTION OF THE DRAWINGS

Example embodiments will now be described more fully hereinafter with reference to the accompanying drawings; however, the example embodiments may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 8 is a diagram illustrating the generated seed data and first extension data.

DETAILED DESCRIPTION

Figure 1:
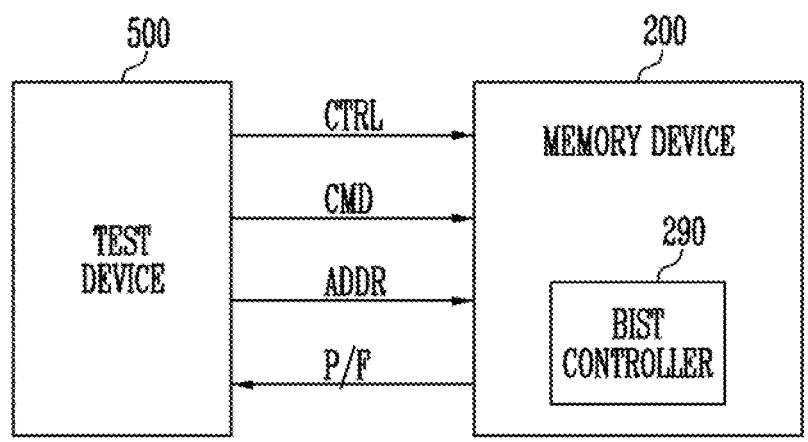
FIG. 1 is a block diagram illustrating a test system including a memory device according to an embodiment of the present disclosure.

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

The embodiments according to the concept of the present disclosure can be variously modified and have various shapes. Thus, the embodiments are illustrated in the drawings and are intended to be described herein in detail. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

So far as not being differently defined, all terms used herein including technical or scientific terminologies have meanings which are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

In describing the embodiments, descriptions will be omitted for techniques that are well known to the art to which the present disclosure pertains, and are not directly related to the present disclosure. This intends to disclose the gist of the present disclosure more clearly by omitting unnecessary description.

Hereinafter, exemplary embodiments of the present disclosure will be described in detail with reference to the accompanying drawings In order for those skilled In the art to be able to readily implement the technical spirit of the present disclosure.

FIG. 1 is a block diagram illustrating a test system including a memory device according to an embodiment of the present disclosure.

Referring to FIG. 1, the test system 50 may include a test device 500 and a memory device 200.

The test system 50 may be used to test an operation of the memory device 200.

The memory device 200 may be a NAND flash memory, a vertical NAND flash memory, a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), or the like. In addition, the memory device 200 of the present disclosure may be implemented in a three-dimensional array structure. The present disclosure may be applied to not only a flash memory device in which a charge storage layer is configured with a floating gate (FG) but also a charge trap flash (CTF) in which a charge storage layer is configured with an insulating layer.

The memory device 200 operates in response to the control of the test device 500. The memory device 200 includes a plurality of memory cells that store data. A test operation of the memory device 200 may be generally divided into a cell test operation which tests whether a failure occurs in memory cells themselves and a data path test operation of testing operations of circuits except the memory cells, without actually storing data in the memory cells.

The memory device 200 may include many circuits that store data in a plurality of memory cells or drives, or controls the memory cells to read data stored in the memory cells. Conventionally, due to a limitation in terms of cost and efficiency of the test device 500, a faulty memory device was detected by simply performing only a cell test at a wafer level of memory devices, and a test was performed on a data path in a process of packaging the memory devices. Therefore, if a failure occurs in any one memory device among a plurality of memory devices stacked in one package in the process of performing a test on the data path, all of the plurality of memory devices stacked in the corresponding package may be discarded.

The memory device 200 according to the embodiment of the present disclosure includes a built-in self-test (BIST) controller 290 capable of performing a BIST operation. According to the embodiment of the present disclosure, a data path test operation can be performed at high speed at a wafer level through a BIST operation. Accordingly, test cost and test time can be reduced. The BIST operation according to the embodiment of the present disclosure may be divided into a BIST write operation and a BIST read operation.

The memory device 200 may receive a control signal CTRL, a command CMD, and an address ADDR from the test device 500. The memory device 200 may perform the BIST write operation or the BIST read operation according to the control signal CTRL, the command CMD, and the address ADDR, which are input from the test device 500. The memory device 200 may perform the BIST read operation and output, to the test device 500, a pass/fail signal P/F indicating whether the BIST read operation has passed or failed.

In an embodiment, the control signal CTRL may correspond to any one of a read enable signal RE and a write enable signal WE. The read enable signal RE may be a control signal indicating that the input command CDM and address ADDR correspond to the BIST read operation, and the write enable signal WE may be a control signal indicating that the input command CMD and address ADDR correspond to the BIST write operation.

If a write command CMD and an address are input from the test device 500, the memory device 200 may store data in memory cells corresponding to the input address ADDR. If a read command CMD and an address ADDR are input from the test device 500, the memory device 200 may read data stored in memory cells corresponding to the input address ADDR.

In an embodiment of the present disclosure, in the BIST write operation, the test device 500 does not provide write data and may provide only the write command CMD and the address ADDR to the memory device 200.

The BIST controller 290 may receive a BIST write command CMD and an address ADDR, and generate pattern data. The BIST controller 290 may input the generated pattern data to a page buffer circuit coupled to memory cells corresponding to the address ADDR.

The BIST controller 290 may receive a BIST read command CMD and an address ADDR from the test device 500, and generate pattern data. The generated pattern data may be reference data. Also, the BIST controller 290 may read data previously stored in a page buffer circuit coupled to memory cells corresponding to the address ADDR. The read data may be sensed data. The BIST controller 290 may compare the reference data with the sensed data. The BIST controller 290 may output a pass/fail signal PF to the test device 500, based on the result of the comparison. For example, if the sensed data and the reference data are the same as each other, the BIST controller 290 may output a pass signal. If the sensed data and the reference data are not the same as each other, the BIST controller 290 may output a fall signal.

A detailed configuration and operation of the BIST controller 290 will be described with reference to FIGS. 2 to 15.

Figure 2:
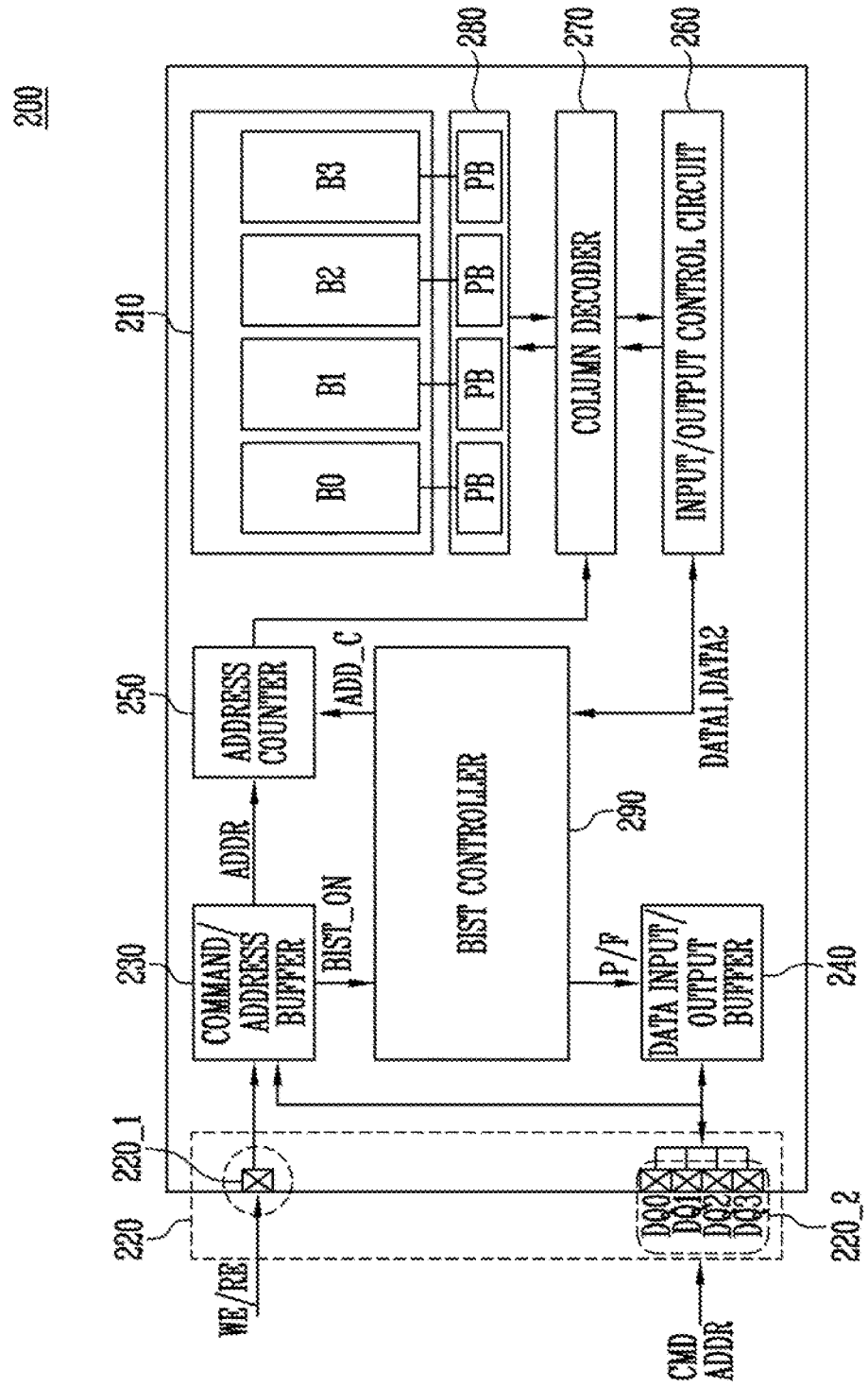
FIG. 2 is a block diagram illustrating a structure of the memory device shown in FIG. 1.

FIG. 2 is a block diagram illustrating a structure of the memory device 200 of FIG. 1.

Referring to FIG. 2, the memory device 200 may include a memory cell array 210, an input/output pad 220, a command/address buffer 230, a data input/output buffer 240, an address counter 250, an input/output control circuit 260, a column decoder 270, a page buffer group 280, and a BIST controller 290.

The memory cell array 210 may include a plurality of memory cells. In an embodiment, the plurality of memory cells are nonvolatile memory cells. Each of the memory cells may be configured as a single level cell (SLC) for storing one bit of data, a multi-level cell (MLC) for storing two bits of data, a triple level cell (TLC) for storing three bits of data, or a quad level cell (QLC) for storing four bit of data.

In an embodiment, the memory cell array 210 may include a plurality of banks. For example, the memory cell array 210 may include bank B0, bank B1, bank B2, and bank B3. In an embodiment, the memory device 200 may independently perform a read, write, or erase operation on each of the banks B0 to B3. Memory cells included in each of the banks B0 to B3 may be coupled to a page buffer circuit PB through bit lines.

The input/output pad 220 may electrically connect the memory device 200 to an external device. The memory device 200 may communicate with the external device through the input/output pad 220. The memory device 200 includes a control signal pad 220_1 for receiving a read enable signal RE or a write enable signal WE and a data pad 220_2 for receiving a command CMD and an address ADDR. The input/output pad 220 included in the memory device 200 may include pads for inputting or outputting various signals, in addition to the control signal pad 220_1 and the data pad 220_2. For example, the data pad 220_2 may include four DQ pads DQ0 to DQ3. In various embodiments, the data pad 220_2 may include 8 DQ pads or 16 DQ pads.

The memory device 200 according to the embodiment of the present disclosure may perform a BIST write operation or a BIST read operation according to BIST enable signal BIST_ON. For example, if the BIST enable signal BIST_ON is input from the test device 500, the memory device 200 may perform the BIST write operation or the BIST read operation. Alternatively, if the BIST enable signal BIST_ON is not input, the memory device 200 may perform a normal write operation, a normal read operation, or an erase operation.

The read enable signal RE input through the control signal pad 220_1 may be a control signal indicating that the command CMD and the address ADDR, which are input through the data pad 220_2, correspond to the BIST read operation, and the write enable signal WE may be a control signal indicating that the command CMD and the address ADDR, which are input through the data pad 220_2, correspond to the BIST write operation.

For example, in the BIST write operation, the memory device 200 may receive a write enable signal WE through the control signal pad 220_1, and receive a command CMD and an address ADDR through the data pad 220_2. Alternatively, in the BIST read operation, the memory device 200 may receive a read enable signal RE through the control signal pad 220_1, and receive a command CMD and an address ADDR through the data pad 220_2.

The command/address buffer 230 may store a command CMD and an address ADDR, which are input through the data pad 220_2, according to the input write enable signal WE. Alternatively, the command/address buffer 230 may store a command CMD and an address ADDR, which are input through the data pad 220_2, according to the input read enable signal RE. In an embodiment, the command/address buffer 230 may include a command buffer for storing a command and an address buffer for storing an address.

The data input/output buffer 240 may not receive write data in the BIST write operation. In the BIST read operation, the data input/output buffer 240 may store a pass/fail signal P/F indicating whether the BIST read operation has passed or failed, and transmit the stored pass/fail signal P/F to the test device 500 through the data pad 220_2.

The address counter 250 may receive an address ADDR from the command/address buffer 230. The address counter 250 may allow the address ADDR to be increased according to an address count signal ADD_C provided from the BIST controller 290. The address counter 250 may provide the column decoder 270 with the address ADDR increased according to the address count signal ADD_C. The column decoder 270 may select a corresponding column address according to the provided address ADDR.

The input/output control circuit 260 may provide data to the page buffer group 280 or receive data from the page buffer group 280 in the BIST write operation or the BIST read operation.

For example, in the BIST write operation, the input/output control circuit 260 may receive first data DATA1 from the BIST controller 290. In an embodiment, the first data DATA1 may be pattern data generated by the BIST controller 290. The input/output control circuit 260 may transfer the first data DATA1 to a page buffer circuit PB included in the page buffer group 280. Specifically, the input/output control circuit 260 may transmit the input first data DATA1 to the page buffer group 280 according to an input control signal IODRV (not shown) input from the BIST controller 290. In this case, data may be stored in a page buffer circuit PB corresponding to a column address selected by the column decoder 270 among a plurality of page buffer circuits PB included in the page buffer group 280.

Alternatively, in the BIST read operation, the input/output control circuit 260 may receive data from the page buffer group 280. Specifically, the input/output control circuit 260 may receive second data DATA2 stored in a page buffer circuit PB of the page buffer group 280 according to an output control signal IOSTB (not shown) input from the BIST controller 290. In an embodiment, the second data DATA2 may be data sensed from a page buffer circuit PB. In this case, data sensed from a page buffer circuit PB corresponding to a column address selected by the column decoder 270 among the plurality of page buffer circuits PBs included in the page buffer group 280 may be output as the second DATA2.

The input/output control circuit 260 may transmit the first data DATA1 or the second data DATA2 through a global data line. For example, one global data line may correspond to each of the banks B0 to B3 of the memory cell array 210.

The BIST controller 290 may be coupled to the command/address buffer 230, the data input/output buffer 240, the address counter 250, and the input/output control circuit 260. The BIST controller 290 may control a BIST operation of the memory device 200. For example, the BIST controller 290 may control the command/address buffer 230, the data input/output buffer 240, the address counter 250, and the input/output control circuit 260 to perform a BIST write operation and a BIST read operation.

In the BIST write operation, the BIST controller 290 may generate pattern data as a first data DATA1 to be stored in a page buffer PB. The BIST controller 290 may provide the first data DATA1 to the Input/output control circuit 260 so as to store the first data DATA1 or the generated pattern data in a page buffer circuit PB coupled to memory cells corresponding to an address ADDR.

In the BIST read operation, the BIST controller 290 may receive second data DATA2 from the input/output control circuit 260. In an embodiment, the second data DATA2 may be sensed data previously stored in a page buffer circuit PB. In addition, the BIST controller 290 may generate pattern data as a reference data to be compared with the second data DATA2. The reference data may be the same data as the first data DATA1, which is the pattern data generated in the BIST write operation.

The BIST controller 290 may compare the sensed data with the reference data generated thereby. The BIST controller 290 may output a pass/fail signal P/F to the data input/output buffer 240, based on the result of the comparison. For example, if the sensed data and the reference data are the same as each other, the BIST controller 290 may output a pass signal. If the sensed data and the reference data are not the same as each other, the BIST controller 290 may output a fail signal.

In an embodiment, the BIST controller 290 may generate various timing control signals for performing the BIST write operation and the BIST read operation, and control the command/address buffer 230, the data input/output buffer 240, the address counter 250, and the input/output control circuit 260 by using the generated timing control signals. For example, the BIST controller 290 may generate an address count signal ADD_C that is a timing control signal for allowing an address ADDR to be increased, and provide the generated address count signal ADD_C to the address counter 250. Alternatively, the BIST controller 290 may generated an input control signal IODRV (not shown) and an output control signal IOSTB (not shown) as timing signals for controlling data input/output of the input/output control circuit 260, and provide the generated input control signal IODRV and output control signal IOSTB to the input/output control circuit 260.

A structure and operation of the BIST controller 290 will be described in more detail with reference to FIG. 3.

Figure 3:
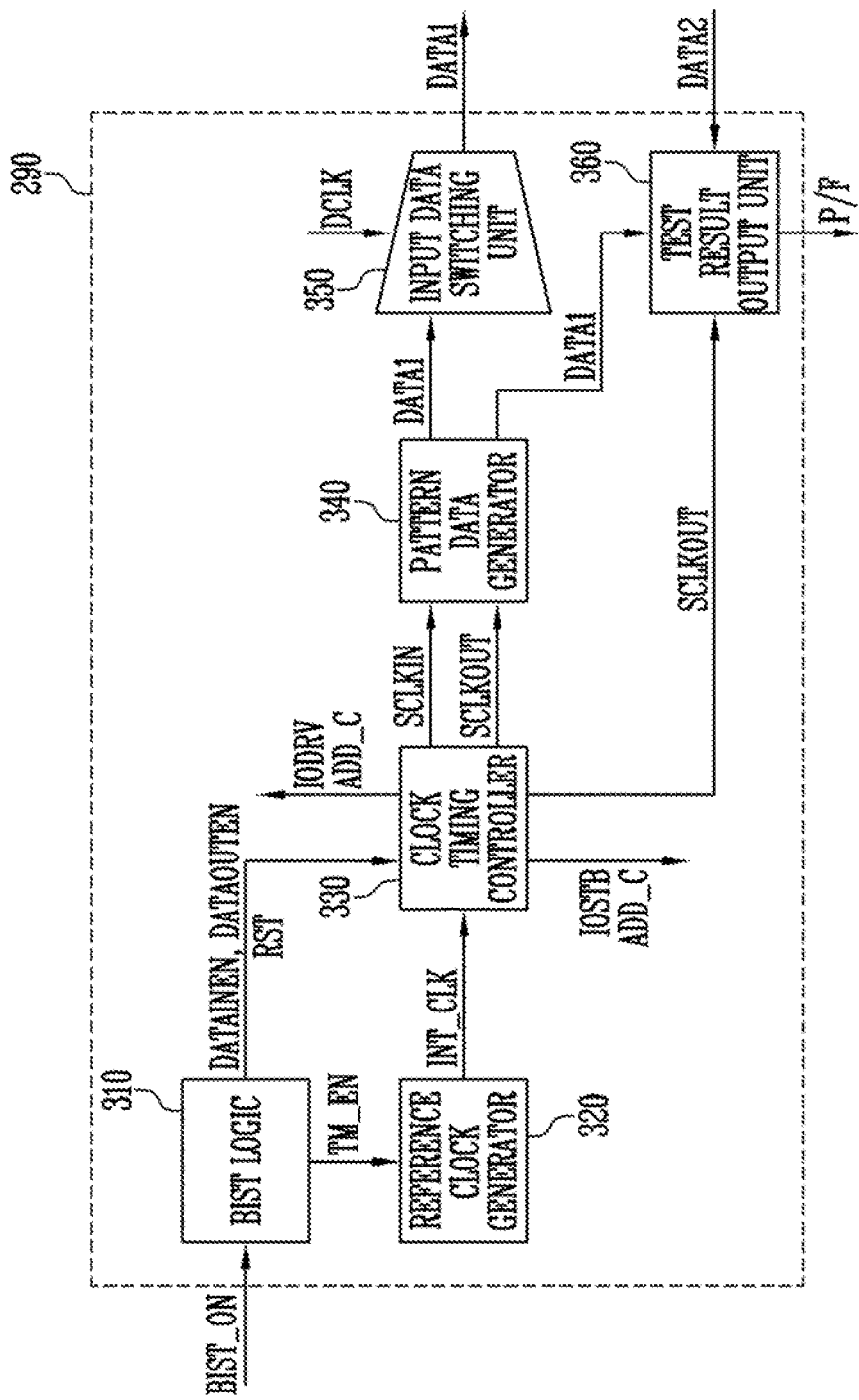
FIG. 3 is a block diagram illustrating a structure of a BIST controller shown in FIG. 2.

FIG. 3 is a block diagram illustrating a structure of the BIST controller 290.

Referring to FIG. 3, the BIST controller 290 may include a BIST logic 310, a reference clock generator 320, a clock timing controller 330, a pattern data generator 340, an input data switching unit 350, and a test result output unit 360.

Hereinafter, for convenience of description, operations of the BIST logic 310, the reference clock generator 320, the clock timing controller 330, the pattern data generator 340, the input data switching unit 350, and the test result output unit 360 will be described for each of the BIST write operation and the BIST read operation with reference to FIGS. 2 and 3.

First, the BIST write operation will be described.

The BIST logic 310 may receive a BIST enable signal BIST_ON from the test device 500. For example, the test device 500 may transmit the BIST enable signal BIST_ON to the memory device 200 so as to test the memory device 200. The BIST enable signal BIST_ON may be transmitted in the form of a command CMD. In response to the BIST enable signal BIST_ON, the BIST logic 310 may output, to the reference clock generator 320, a control signal for generating a reference clock that becomes a reference of a plurality of timing signals used in the BIST operation.

For example, the BIST logic 310 may provide a test mode enable signal TM_EN to the reference clock generator 320 in response to the BIST enable signal BIST_ON. The BIST logic 310 may output the test mode enable signal TM_EN during a time preset by the test device 500 or until the BIST enable signal BIST_ON is no longer provided. Alternatively, the BIST logic 310 may receive a BIST reset signal as a command CMD from the test device 500, and stop the output of the test mode enable signal TM_EN in response to the BIST reset signal.

The BIST logic 310 may output any one of a data input enable signal DATAINEN, a data output enable signal DATAOUTEN, and a reset signal RST to the clock timing controller 330 according to the BIST enable signal BIST_ON. For example, in the BIST write operation, the BIST logic 310 may output the data input enable signal DATAINEN to the clock timing controller 330.

The reference clock generator 320 may generate a reference clock INT_CLK in response to the test mode enable signal TM_EN input from the BIST logic 310.

The reference clock generator 320 may be implemented as an oscillator controlled in a digital manner. For example, the reference clock generator 320 may generate a current source by using a voltage-current converter (V-I converter), and adjust a target frequency by controlling the current source.

In an embodiment, the reference clock generator 320 may be implemented as a quadrature pseudo-differential current-controlled oscillator.

In an embodiment, the frequency of the reference clock INT_CLK output from the reference clock generator 320 may be, for example, 1.2 GHz or 1.333 GHz. However, the frequency of the reference clock INT_CLK is not limited thereto, and the reference clock INT_CLK having various frequencies may be generated by adjusting a test speed. The reference clock generator 320 outputs the generated reference clock INT_CLK to the clock timing controller 330.

The clock timing controller 330 may generate an input sample clock SCLKIN to be output as pattern data by using the reference clock INT_CLK provided from the reference clock generator 320 and the data input enable signal DATAINEN provided from the BIST logic 310.

For example, the clock timing controller 330 may generate the reference clock INT_CLK as the input sample clock SCLKIN while the data input enable signal DATAINEN is being input. That is, the clock timing controller 330 may generate the input sample clock SCLKIN by masking the reference clock INT_CLK while the data input enable signal DATAINEN is being input. The clock timing controller 330 may output the input sample clock SCLKIN to the pattern data generator 340.

In an embodiment, the clock timing controller 330 may generate an input control signal IODRV and an address count signal ADD_C based on any one of the reference clock INT_CLK provided from the reference clock generator 320 or the input sample clock SCLKIN. The clock timing controller 330 may output the input control signal IODRV and address count signal ADD_C to the input/output control circuit 260 and the address counter 250, respectively, as described with reference to FIG. 2.

The pattern data generator 340 may generate pattern data to be stored in the page buffer circuit PB described with reference to FIG. 2 through the BIST write operation. The pattern data generator 340 may receive the input sample clock SCLKIN from the clock timing controller 330, and generate pattern data according to the received input sample clock SCLKIN. In an embodiment, seed values of the pattern data may be sequentially increased, which will be described with reference to FIG. 5.

Specifically, first, the pattern data generator generates 4-bit seed data. Bit values of the 4-bit seed data may be sequentially increased along rising and falling edges of the input sample clock SCLKIN. The pattern data generator 340 may generate 8-bit extension data by combining the generated 4-bit seed data with an inversed version of the 4-bit seed data. The pattern data generator 340 may generate 16-bit pattern data by combining two copies of the 8-bit extension data. In an embodiment, the pattern data generator 340 may be implemented using a 4-bit internal-feedback linear feedback shift register (LFSR).

The pattern data generator 340 may provide the generated pattern data as first data DATA1 to the input data switching unit 350.

A structure and operation of the pattern data generator 340 will be described in more detail with reference to FIGS. 4 to 8.

The input data switching unit 350 may receive an input data alignment signal DCLK generated by the clock timing controller 330. The input data switching unit 350 may provide the first data DATA1 to the input/output control circuit 260 described with reference to FIG. 2 according to the input data alignment signal DCLK. The input data alignment signal DCLK may be synchronized with any one of the input control signal IODRV and the address count signal ADD_C. The first data DATA1 output from the pattern data generator 340 may be aligned by the input data alignment signal DCLK to be input to the input/output control circuit 260. The input data alignment signal DCLK may be generated by the clock timing controller 330 based on any one of the input control signal IODRV and the address count signal ADD_C. Then, the input/output control circuit 260 may transmit the input data alignment signal DCLK to the page buffer group 280 according to the input control signal IODRV. In this case, the first data DATA1 may be stored in a page buffer circuit PB corresponding to a column address selected by the column decoder 270 among the plurality of page buffer circuits PB included in the page buffer group 280.

A configuration and operation of the input data switching unit 350 will be described in more detail with reference to FIG. 10.

Next, the BIST read operation will be described.

The BIST logic 310 may receive a BIST enable signal BIST_ON from the test device 500. For example, the test device 500 may transmit the BIST enable signal BIST_ON to the memory device 200 so as to test the memory device 200. The BIST enable signal BIST_ON may be transmitted in the form of a command. In response to the BIST enable signal BIST_ON, the BIST logic 310 may output, to the reference clock generator 320, a control signal for generating a reference clock that becomes a reference of a plurality of timing signals used in the BIST operation.

For example, the BIST logic 310 may provide a test mode enable signal TM_EN to the reference clock generator 320 in response to the BIST enable signal BIST_ON. The BIST logic 310 may output the test mode enable signal TM_EN during a time preset by the test device 500, or until the BIST enable signal BIST_ON is no longer provided. Alternatively, the BIST logic 310 may receive a BIST reset signal as a command CMD from the test device 500, and stop the output of the test mode enable signal TM_EN in response to the BIST reset signal.

The BIST logic 310 may output any one of a data input enable signal DATAINEN, a data output enable signal DATAOUTEN, and a reset signal RST to the clock timing controller 330 according to the BIST enable signal BIST_ON. For example, in the BIST write operation, the BIST logic 310 may output the data input enable signal DATAINEN to the clock timing controller 330.

The reference clock generator 320 may generate a reference clock INT_CLK in response to the test mode enable signal TM_EN input from the BIST logic 310.

The reference clock generator 320 may be implemented as an oscillator controlled in a digital manner. For example, the reference clock generator 320 may generate a current source by using a voltage-current converter (V-I converter), and adjust a target frequency by controlling the current source.

In an embodiment, the reference clock generator 320 may be implemented as a quadrature pseudo-differential current-controlled oscillator.

In an embodiment, the frequency of the reference clock INT_CLK output from the reference clock generator 320 may be, for example, 1.2 GHz or 1.333 GHz. However, the frequency of the reference clock INT_CLK is not limited thereto, and the reference clock INT_CLK having various frequencies may be generated by adjusting a test speed. The reference clock generator 320 outputs the generated reference clock INT_CLK to the clock timing controller 330.

The clock timing controller 330 may generate an output control signal IOSTB and an address count signal ADD_C by using the reference clock INT_CLK provided from the reference clock generator 320 and the data input enable signal DATAINEN provided from the BIST logic 310.

For example, the clock timing controller 330 may generate the reference clock INT_CLK as the output control signal IOSTB and the address count signal ADD_C while the data input enable signal DATAINEN is being input. That is, the clock timing controller 330 may generate the output control signal IOSTB and the address count signal ADD_C by masking the reference clock INT_CLK while the data input enable signal DATAINEN is being input. The clock timing controller 330 may output the output control signal IOSTB and the address count signal ADD_C to the input/output control circuit 260 and the address counter 250, respectively, as described with reference to FIG. 2.

The address counter 250 described with reference to FIG. 2 may provide an address ADDR to the column decoder 270 according to the received address count signal ADD_C. The column decoder 270 may select a corresponding column address according to the received address ADDR.

The input/output control circuit 260 may receive data from the page buffer group 280. Specifically, the input/output control circuit 260 may receive second data DATA2 stored in page buffer circuits PB of the page buffer group 280 according to the output control signal IOSTB. In an embodiment, the second data DATA2 may be sensed data previously stored in a page buffer circuit PB. In this case, data stored in a page buffer circuit PB corresponding to a column address selected by the column decoder 270 among the plurality of page buffer circuits PBs included in the page buffer group 280 may be output as the second DATA2.

The clock timing controller 330 may generate an output sample clock SCLKOUT to be output to the pattern data generator 340 by using the output control signal IOSTB and the reference clock INT_CLK. For example, the clock timing controller 330 may generate the output sample clock CLKOUT by sampling the reference clock INT_CLK according to the output control signal IOSTB as a triggering signal.

The clock timing controller 330 may output the output sample clock SCLKOUT to the pattern data generator 340.

In the BIST read operation, the pattern data generator 340 may generate reference data to be compared with data read from the page buffer circuits PB. The reference data may be pattern data generated in the BIST write operation. That is, the reference data may be the same data as the first data DATA1. The pattern data generator 340 may receive an output sample clock SCLKOUT from the clock timing controller 330, and generate reference data according to the received output sample clock SCLKOUT.

The pattern data generator 340 may output the reference data to the test result output unit 360.

The test result output unit 360 receives the first data DATA1 provided from the pattern data generator 340 and the second data DATA2 output from the input/output control circuit 260.

The test result output unit 360 may compare the first data DATA1 with the second data DATA2, and output a pass/fail signal P/F to the data input/output buffer 240, based on the result of the comparison. For example, if the second data DATA2 as the sensed data is the same as the first data DATA1 as the reference data, the test result output unit 360 may output a pass signal P. If the second data DATA2 is not the same as the first data DATA1, the test result output unit 360 may output a fail signal F.

A configuration and operation of the test result output unit 360 will be described in more detail with reference to FIGS. 12 to 15.

Figure 4:
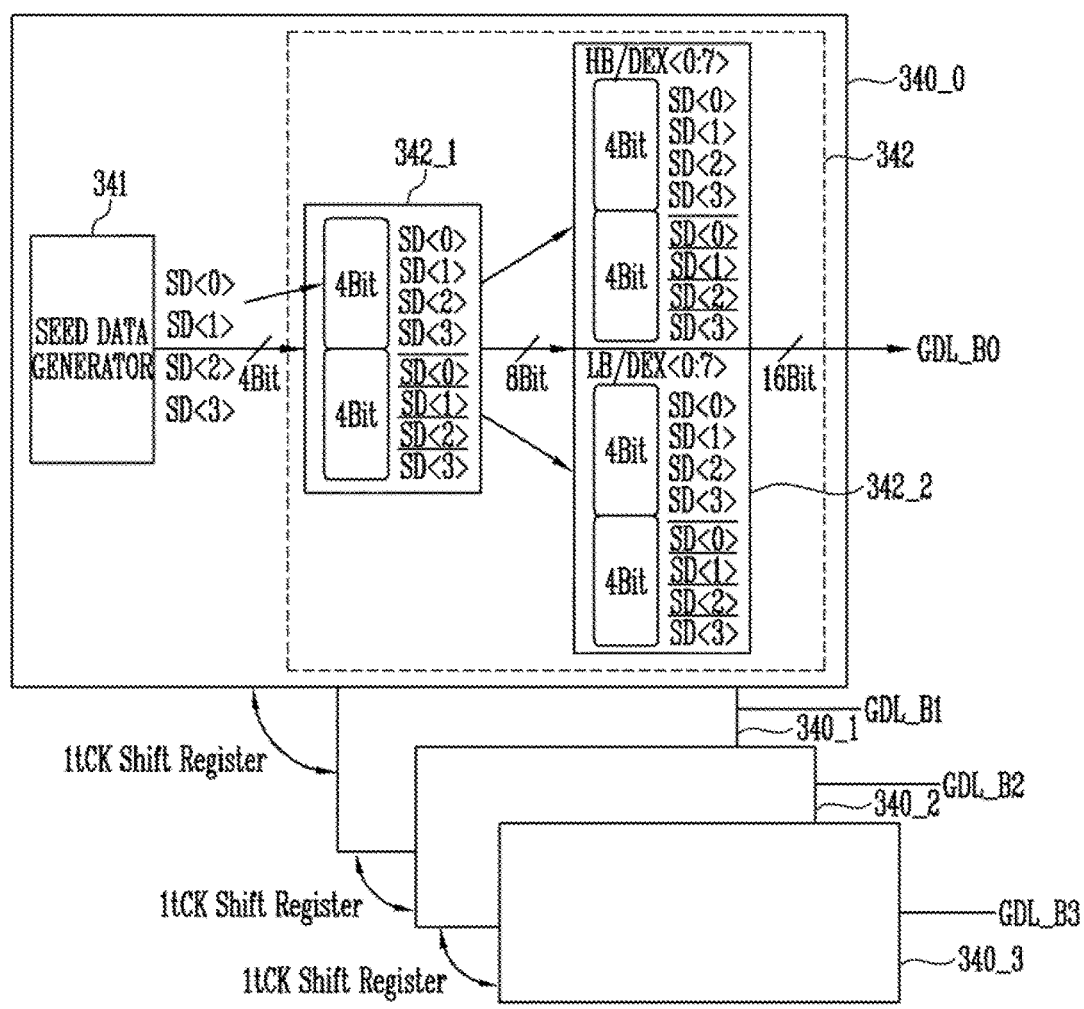
FIG. 4 is a block diagram illustrating a structure of a pattern data generator shown in FIG. 3.

FIG. 4 is a block diagram illustrating a structure of the pattern data generator 340 of FIG. 3.

Referring to FIG. 4, the pattern data generator 340 may include a seed data generator 341 and a data extension unit 342.

The seed data generator 341 generates 4-bit seed data. The seed data may be transmitted to the data extension unit 342. A method of generating seed data will be described in more detail with reference to FIGS. 5 to 8.

The data extension unit 342 may include a first extension unit 342_1 and a second extension unit 342_2.

The first extension unit 342_1 generates first extension data by extending 4-bit seed data to 8-bit data, and the second extension unit 342_2 generates second extension data by extending the 8-bit first extension data to 16-bit data.

Specifically, the seed data SD<0> to SD<3> may be configured with 4 bits. The first extension unit 342_1 generates 8-bit first extension data by combining the 4-bit seed data with inversed version of the 4-bit seed data.

The second extension unit 342_2 generates 16-bit second extension data using 8-bit first extension data as a high byte HB and a low byte LB. That is, the second extension data may be 16-bit data configured with two copies of the 8-bit first extension data.

Since the seed data is a data changed with a certain pattern according to an input signal, the second extension data may be changed as the seed data is changed. Therefore, the second extension data may also be data changed with the certain pattern. The second extension data may be the pattern data or the first data DATA1 described with reference to FIGS. 2 and 3.

In an embodiment, the pattern data may be output to global data lines GDL_B<0:3> respectively corresponding to the plurality of banks B0 to B3. In this case, the pattern data output to each global data line may be output with a time difference corresponding to one period 1tCK of the reference clock INT_CLK. For example, pattern data output to the bank B0 may be output through a zeroth global data line GDL_B0. Pattern data output to the bank B1 may have a delay of 1tCK with the pattern data output to the zeroth global data line GDL_B0, and may be output through a first global data line GDL_B1. Pattern data output to the bank B2 may have a delay of 1tCK with the pattern data output to the first global data line GDL_B1, and may be output through a second global data line GDL_B2. Pattern data output to the bank B3 may have a delay of 1tCK with the pattern data output to the second global data line GDL_B2, and may be output through a third global data line GDL_B3.

In an embodiment, the pattern data may be simultaneously output to the global data lines GDL_B<0:3> respectively corresponding to the plurality of banks B0 to B3.

Figure 5:
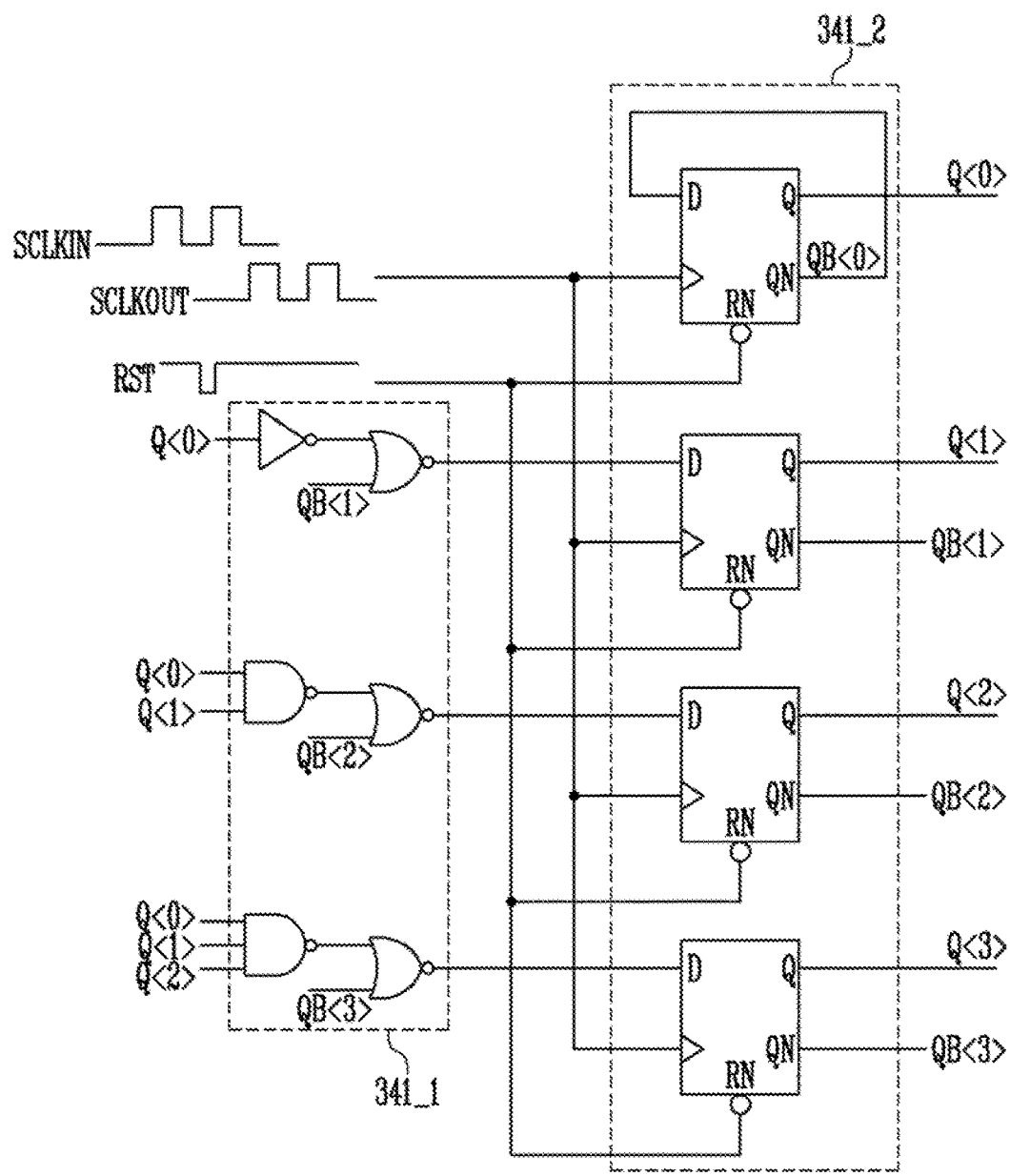
FIG. 5 is a circuit diagram illustrating a seed value generator included in a seed data generator shown in FIG. 4.

FIG. 5 is a circuit diagram illustrating a seed value generator included in the seed data generator 341 of FIG. 4.

Referring to FIG. 5, the seed data generator 341 may include a seed value generator. The seed value generator may include a seed value input unit 341_1 and a seed value output unit 341_2. The seed value generator may generate a seed value Q<0> to Q<3> according to an input sample clock SCLKIN or output sample clock SCLKOUT input thereto, and finally generate seed data SD<0> to SD<3> described with reference to FIG. 4.

The seed value input unit 341_1 determines values input to a plurality of D-flip flops included in the seed value output unit 341_2, using previously generated seed value Q<0> to Q<3>.

The seed value output unit 341_2 receives an input of the seed value input unit 341 and outputs a seed value Q<0> to Q<3>.

The seed value Q<0> to Q<3> may be 4-bit data sequentially increased according to a rising edge and/or a falling edge of the input sample clock SCLKIN or output sample clock SCLKOUT.

The seed data generator 341 generates the 4-bit seed data by using the seed value Q<0> to Q<3>.

In some embodiments, the seed data generator 341 may be implemented using a 4-bit internal-feedback LFSR.

Figure 6:
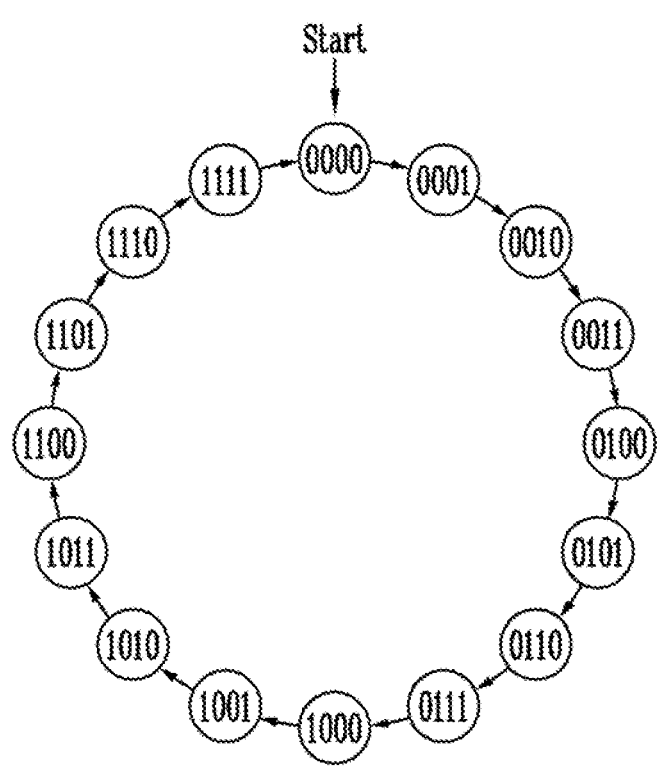
FIG. 6 is a diagram illustrating a seed value of seed data.

FIG. 6 is a diagram illustrating the seed value Q<0> to Q<3> of the 4-bit seed data.

An initial value of the seed value Q<0> to Q<3> is set to '0000.' Subsequently, the seed value Q<0> to Q<3> may have 4-bit data sequentially increased according to a circuit operation of the seed to value generator of FIG. 5. That is, the seed value Q<0> to Q<3> may be sequentially increased in a bitwise manner from '0000' to '1111', for example, '0000'→'0001'→'0010'→'0011'→'0100'→'0101'→'0110'→'0111'→'1000'→'1001'→'1010'→'1011'→'1100'→'1101'→'1110'→'1111'. After the seed value Q<0> to Q<3> is increased from '0000' to '1111,' the seed value Q<0> to Q<3> may be again set to '0000.' Therefore, 16 rising and falling edges of the input sample clock SCLKIN or output sample clock SCLKOUT are required until the seed value Q<0> to Q<3> are increased from '0000' to '1111.'

Figure 7:
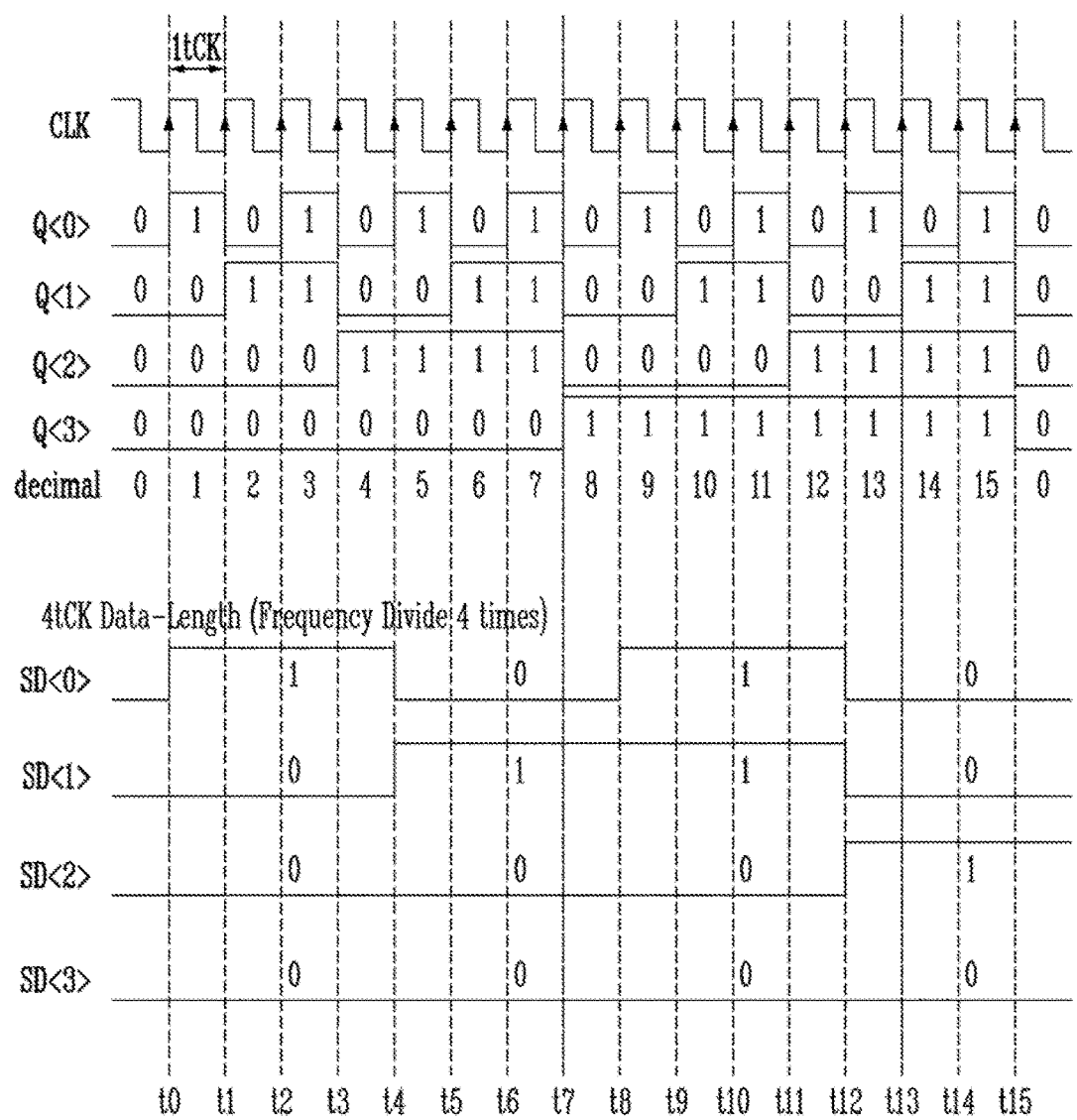
FIG. 7 is a diagram illustrating a method for generating seed data depending on a seed value.

FIG. 7 is a diagram illustrating a method for generating seed data depending on the seed value Q<0> to Q<3>.

Referring to FIG. 7, the seed value Q<0> to Q<3> sequentially increases in a bitwise manner along rising edges of an input clock signal CLK according to the method described with reference to FIG. 5. The seed value Q<0> to Q<3> may increase for every 1tCK. In an embodiment, the clock signal CLK of FIG. 7 may correspond to any one of the input sample signal SCLKIN and the output sample signal SCLKOUT.

The seed data SD<0> to SD<3> may have four times lower frequency than the seed value Q<0> to Q<3> to increase binary value of the seed data SD<0> to SD<3> for every 4tCK. Consequently, the pattern data SD<0> to SD<3> generated using the seed data Q<0> to Q<3> may have a binary value increasing for every 4tCK.

FIG. 8 is a diagram illustrating the generated seed data Q<0> to Q<3> and the 8-bit first extension data.

Referring to FIG. 8, 16 numbers of the 8-bit first extension data are illustrated. Extension data is 8-bit data, data corresponding to 100 to 103 may be the 4-bit seed data, and data corresponding to 104 to 107 may be the inversed version of the 4-bit seed data.

Figure 9:
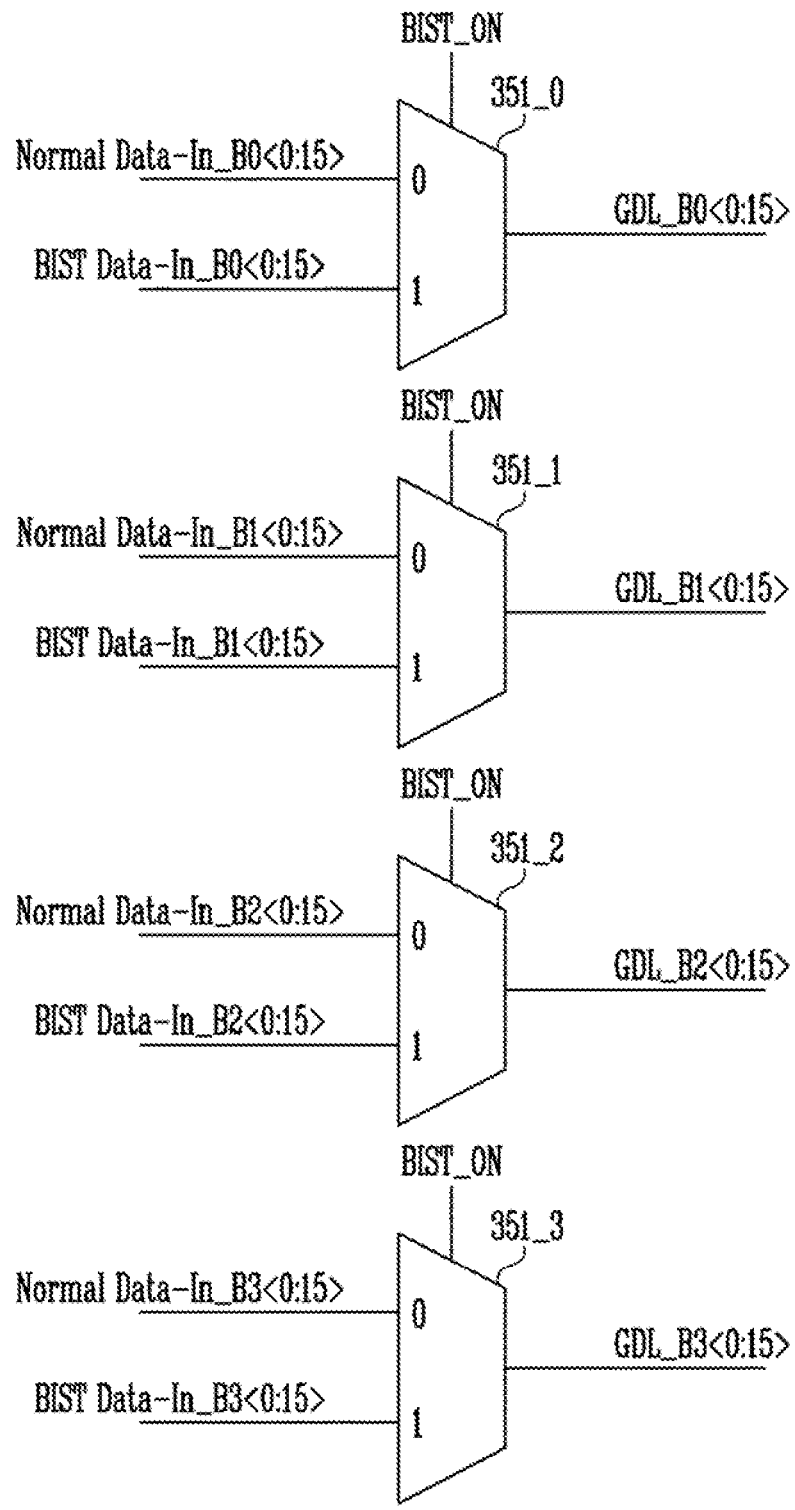
FIG. 9 is a diagram illustrating a structure of an input data switching unit shown in FIG. 3.

FIG. 9 is a diagram illustrating a structure of the input data switching unit 350 of FIG. 3.

Referring to FIG. 9, the input data switching unit 350 may include a plurality of input data switches 351_0 to 351_3.

The plurality of input data switches 351_0 to 351_3 may be coupled to a plurality of global data lines GDL_B0<0:15> to GDL_B3<0:15>, respectively. The plurality of input data switches 351_0 to 351_3 have the same configuration. Therefore, hereinafter, an operation of the input data switch 351_0 will be described as an example.

The input data switch 351_0 may receive normal data Normal Data-In_B0<0:15> or BIST data BIST Data-In_B0<0:15>, and output only any one of the two data Normal Data-In_B0<0:15> and BIST data BIST Data-In_B0<0:15> to the global data line GDL_B0<0:15>.

Specifically, the input data switch 351_0 may receive the normal data Normal Data-In_B0<0:15> or the BIST data BIST Data-In_B0<0:15> according to whether the BIST enable signal BIST_ON is input, and output only any one of the two data Normal Data-In_B0<0:15> and BIST data BIST Data-In_B0<0:15> to the global data line GDL_B0<0:15>. For example, if the BIST enable signal BIST_ON is input, the input data switch 351_0 outputs the BIST data BIST Data-In_B0<0:15> to the global data line GDL_B0<0:15>. If the BIST enable signal BIST_ON is not input, the input data switch 351_0 outputs the normal data Normal Data-In_B0<0:15> to the global data line GDL_B0<0:15>.

Figure 10:
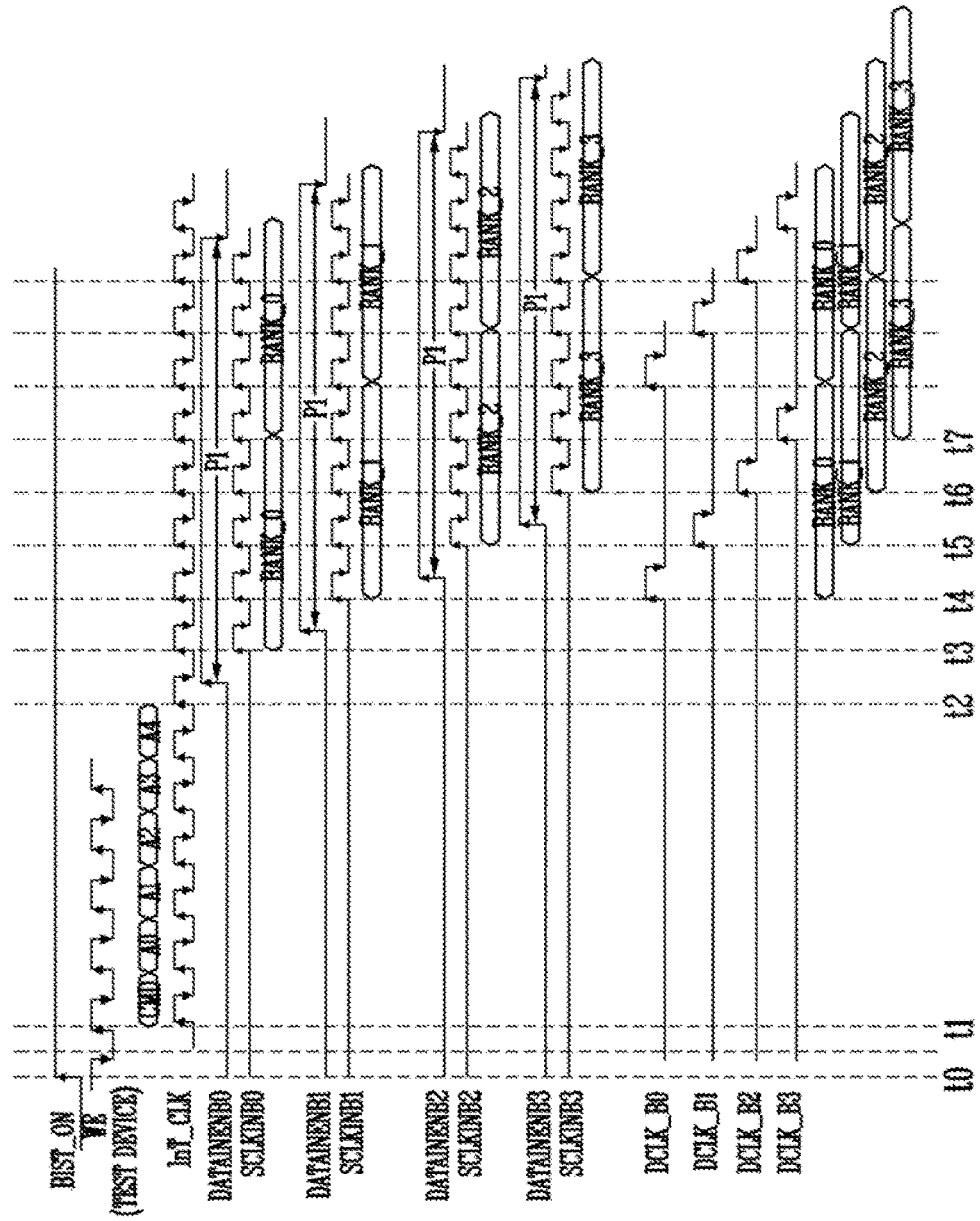
FIG. 10 is a timing diagram illustrating a BIST write operation in accordance with an embodiment of the present disclosure.

FIG. 10 is a timing diagram illustrating a BIST write operation according to an embodiment of the present disclosure.

Referring to FIGS. 2, 3, and 10, at t0, a BIST enable signal BIST_ON is input. At t0, the memory device 200 may receive a write enable signal WE indicating that a command CMD and an address ADDR input from the test device 500 correspond to the BIST write operation. The BIST logic 310 outputs a test mode enable signal TM_EN to the reference clock generator 320 in response to the BIST enable signal BIST_ON.

At t1, the reference clock generator 320 generates a reference clock Int_CLK according to the test mode enable signal TM_EN.

Before t2, the memory device 200 may receive a command and addresses A0 to A4 from the test device 500.

At a time between t2 and t3, the BIST logic 310 may output a data input enable signal DATAINENB0 for the bank B0 to the clock timing controller 330. The clock timing controller 330 may output the reference clock Int_CLK input thereto as an input sample clock SCLKINB0 for the bank B0 while the data input enable signal DATAINENB0 is being input. The pattern data generator 340 generates pattern data BANK_0 on the bank B0 according to the input sample clock SCLKINB0 input thereto.

At a time between t3 and t4, the BIST logic 310 may output a data input enable signal DATAINENB1 for the bank B1 to the clock timing controller 330. The clock timing controller 330 may output the reference clock Int_CLK input thereto as an input sample clock SCLKINB1 for the bank B1 while the data input enable signal DATAINENB1 is being input. The pattern data generator 340 generates pattern data BANK_1 on the bank B1 according to the input sample clock SCLKINB1 input thereto.

At a time between t4 and t5, the BIST logic 310 may output a data input enable signal DATAINENB2 for the bank B2 to the clock timing controller 330. The clock timing controller 330 may output the reference clock Int_CLK input thereto as an input sample clock SCLKINB2 for the bank B2 while the data input enable signal DATAINENB2 is being input. The pattern data generator 340 generates pattern data BANK_2 on the bank B2 according to the input sample clock SCLKINB2 input thereto.

At a time between t5 and t6, the BIST logic 310 may output a data input enable signal DATAINENB3 for the bank B3 to the clock timing controller 330. The clock timing controller 330 may output the reference clock Int_CLK input thereto as an input sample clock SCLKINB3 for the bank B3 while the data input enable signal DATAINENB3 is being input. The pattern data generator 340 generates pattern data BANK_3 on the bank B3 according to the input sample clock SCLKINB3 input thereto. The generated pattern data BANK_0 to BANK_3 are input to the input data switching unit 350.

At t4, the input data switching unit 350 may receive an input data alignment signal DCLK_B0 for the bank B0, which the clock timing controller 330 generates. The input data switching unit 350 may provide the pattern data BANK_0 to the input/output control circuit 260 according to the input data alignment signal DCLK_B0. The input data alignment signal DCLK_B0 may be synchronized with the input control signal IODRV and the address count signal ADD_C. Subsequently, the input/output control circuit 260 may transmit the input data alignment signal DCLK_B0 to the page buffer group 280 according to the input control signal IODRV. In this case, data may be stored in a page buffer circuit PB corresponding to a column address of the bank B0, which is selected by the column decoder 270, among the plurality of page buffer circuits PB included in the page buffer group 280.

At t5, the input data switching unit 350 may receive an input data alignment signal DCLK_B1 for the bank B1, which the clock timing controller 330 generates. The input data switching unit 350 may provide the pattern data BANK_1 to the input/output control circuit 260 according to the input data alignment signal DCLK_B1. The input data alignment signal DCLK_B1 may be synchronized with the input control signal IODRV and the address count signal ADD_C. Subsequently, the input/output control circuit 260 may transmit the input data alignment signal DCLK_B1 to the page buffer group 280 according to the input control signal IODRV. In this case, data may be stored in a page buffer circuit PB corresponding to a column address of the bank B1, which is selected by the column decoder 270, among the plurality of page buffer circuits PB included in the page buffer group 280.

At t6, the input data switching unit 350 may receive an input data alignment signal DCLK_B2 for the bank B2, which the clock timing controller 330 generates. The input data switching unit 350 may provide the pattern data BANK_2 to the input/output control circuit 260 according to the input data alignment signal DCLK_B2. The input data alignment signal DCLK_B2 may be synchronized with the input control signal IODRV and the address count signal ADD_C. Subsequently, the input/output control circuit 260 may transmit the input data alignment signal DCLK_B2 to the page buffer group 280 according to the input control signal IODRV. In this case, data may be stored in a page buffer circuit PB corresponding to a column address of the bank B2, which is selected by the column decoder 270, among the plurality of page buffer circuits PB included in the page buffer group 280.

At t7, the input data switching unit 350 may receive an input data alignment signal DCLK_B3 for the bank B3, which the clock timing controller 330 generates. The input data switching unit 350 may provide the pattern data BANK_3 to the input/output control circuit 260 according to the input data alignment signal DCLK_B3. The input data alignment signal DCLK_B3 may be synchronized with the input control signal IODRV and the address count signal ADD_C. Subsequently, the input/output control circuit 260 may transmit the input data alignment signal DCLK_B3 to the page buffer group 280 according to the input control signal IODRV. In this case, data may be stored in a page buffer circuit PB corresponding to a column address of the bank B3, which is selected by the column decoder 270, among the plurality of page buffer circuits PB included in the page buffer group 280.

Figure 11:
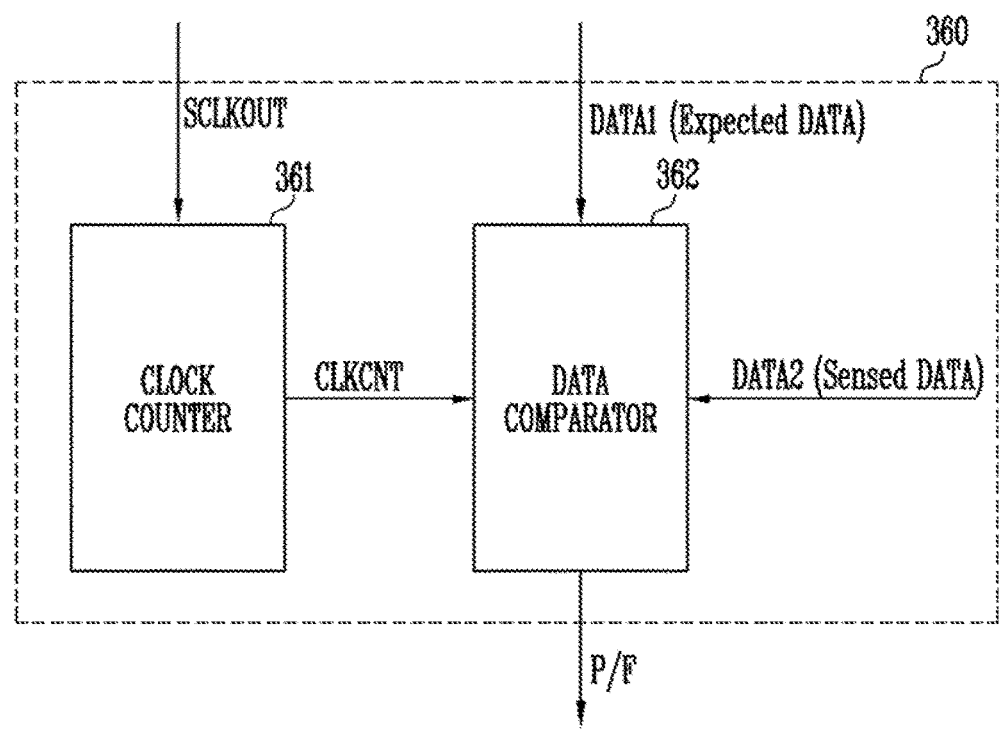
FIG. 11 is a block diagram illustrating a structure of a test result output unit shown in FIG. 3.

FIG. 11 is a block diagram illustrating a structure of the test result output unit 360 of FIG. 3.

Referring to FIG. 11, the test result output unit 360 may include a clock counter 361 and a data comparator 362. The clock counter 361 counts an output sample clock SCLKOUT. The clock counter 361 generates an output data alignment signal CLKCNT for allowing the first and second data DATA1 and DATA2 to be synchronized with each other for the data comparator 362 to compare first data DATA1 and second data DATA2. The clock counter 361 may provide the generated data alignment signal CLKCNT to the data comparator 362.

Specifically, the clock counter 361 may count an output sample clock SCLKOUT input thereto by any one of two or three periods of the output sample clock SCLKOUT, and generate an output data alignment signal CLKCNT activated at a time delayed by the corresponding period. The output data alignment signal CLKCNT may have a period corresponding to four periods of the output sample clock SCLKOUT, which become a time when data is input/output.

The data comparator 362 allows the first data DATA1 and the second data DATA2 to be synchronized with each other. The data comparator 362 may compare the first data DATA1 with the second data DATA2 and output a pass/fail signal P/F to the data input/output buffer 240 described with reference to FIG. 2 based on the result of the comparison. For example, if the sensed data and the reference data are the same as each other, the data comparator 362 may output a pass signal P. If the sensed data and the reference data are not the same as each other, the data comparator 362 may output a fail signal F. A structure of the data comparator 362 will be described in detail with reference to FIGS. 12 and 13.

Figure 12:
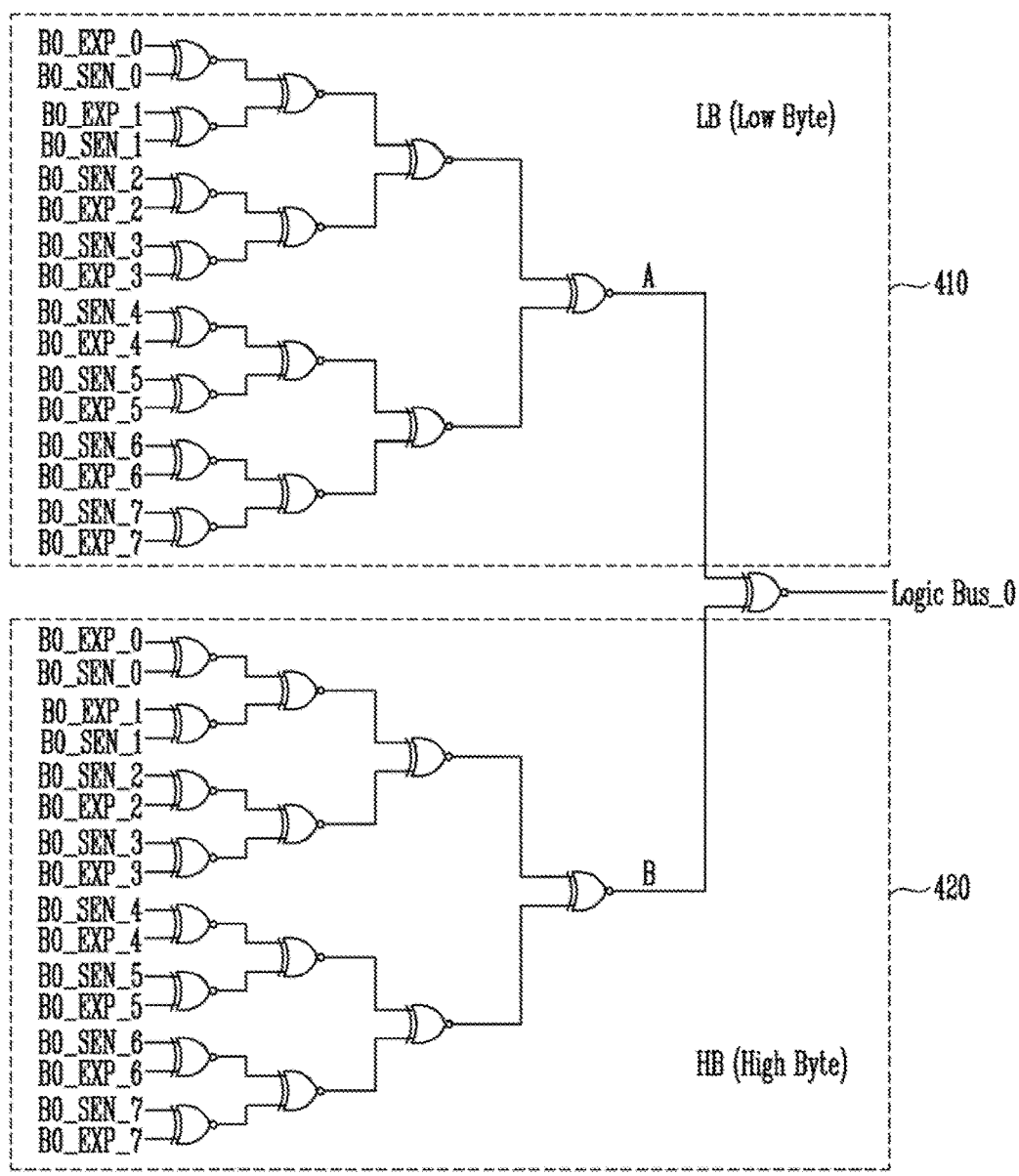
FIG. 12 is a diagram illustrating an embodiment of a data comparator shown in FIG. 11.

FIG. 12 is a diagram illustrating an embodiment of the data comparator 362 of FIG. 11.

Referring to FIG. 12, the data comparator 362 may include a high byte (HB) comparator 420 and a low byte (LB) comparator 410.

FIG. 12 illustrates a data comparator 362_1 for the bank B0. Therefore, the number of data comparators 362_1 may be changed depending on how many banks constitute the memory cell array included in the memory device. In addition, it will be understood that data comparators for the other banks are configured identically to one another.

Outputs such as, values A and B which will be described later, of the high byte (HB) comparator 420 and an output of the low byte (LB) comparator 410 may be coupled to an XOR gate that performs an exclusive logical sum operation, and an output of the XOR gate may be output to a logic bus 0 Logic_Bus_0.

The low byte comparator 410 compares 8 bits of low byte (LB) of the first data DATA1 and 8 bits of low byte (LB) of the second data DATA2 on a bitwise basis. The first data DATA1 may be a reference data, and the second data DATA2 may be a sensed data obtained by sensing a pattern data stored on a page buffer circuit PB. Specifically, the low byte comparator 410 may compare the reference data and the sensed data on a bit-by-bit basis by using an XOR gate that performs a logical sum operation on bits corresponding to the same position. For example, the low byte comparator 410, through an XOR operation, may compare a zeroth bit B0_EXP_0 of the reference data and a zeroth bit B0_SEN_0 of the sensed data, compare a first bit B0_EXP_1 of the reference data and a first bit B0_SEN_1 of the sensed data, compare a second bit B0_EXP_2 of the reference data and a second bit B0_SEN_2 of the sensed data, compare a third bit B0_EXP_3 of the reference data and a third bit B0_SEN_3 of the sensed data, compare a fourth bit B0_EXP_4 of the reference data and a fourth bit B0_SEN_4 of the sensed data, compare a fifth bit B0_EXP_5 of the reference data and a fifth bit B0_SEN_5 of the sensed data, compare a sixth bit B0_EXP_6 of the reference data and a sixth bit B0_SEN_6 of the sensed data, and compare a seventh bit B0_EXP_7 of the reference data and a seventh bit B0_SEN_7 of the sensed data.

In addition, the low byte comparator 410 may compare the XOR operation result of the zeroth bits and the XOR operation result of the first bits through an XOR operation, compare the XOR operation result of the second bits and the XOR operation result of the third bits through an XOR operation, compare the XOR operation result of the fourth bits and the XOR operation result of the fifth bits through an XOR operation, and compare the XOR operation result of the sixth bits and the XOR operation result of the seventh bits through an XOR operation.

As a result obtained by performing operations in this manner, if low-byte data correspond to one another, value A may be 0. If any one bit does not correspond to the other bits, value A may be 1. The value A is of the output of the low byte (LB) comparator 410.

The high byte (HB) comparator 420 may operate with 8 bits of high byte (HB) of the first data DATA1 and 8 bits of high byte (HB) of the second data DATA2 in the same way as the low byte (LB) comparator 410. By performing operations in the same manner as the low byte (LB) comparator 410, if high-byte data correspond to one another, value B may be 0. If any one bit does not correspond to the other bits, value B may be 1. The value B is of the output of the high byte (HB) comparator 420.

If the values A and B are finally compared using a final XOR operation, value 0 or 1 may be obtained. Specifically, if the value output to Logic-Bus_0 is 0, the reference data and the sensed data of the corresponding bank are the same as each other. If the value output to Logic-Bus_0 is 1, the reference data and the sensed data of the corresponding bank are not the same as each other.

When the first data DATA1 that is the reference data and the second data DATA2 that is the sensed data are the same as each other as a result obtained by comparing data of the corresponding bank in this manner, the corresponding data path of the memory device is determined as normally operated. On the contrary, when the first data DATA1 and the second data DATA2 are not the same as each other, the corresponding data path of the memory device is determined as not normally operated.

Figure 13:
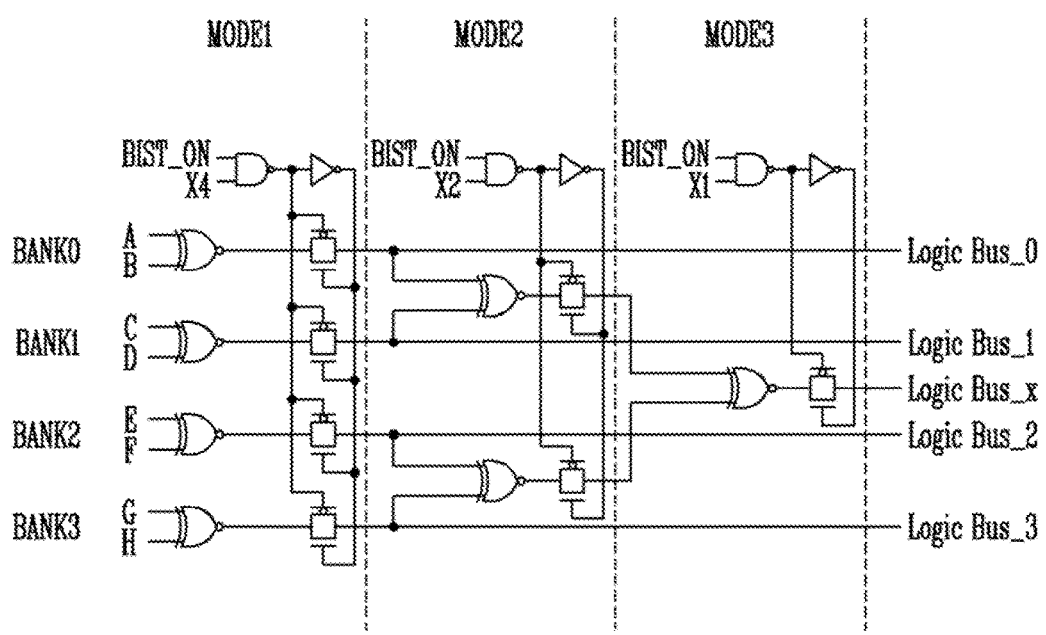
FIG. 13 is a diagram illustrating another embodiment of the data comparator shown in FIG. 11.

FIG. 13 is a diagram illustrating another embodiment of the data comparator 362 of FIG. 11.

Referring to FIG. 13, the data comparator 362_2 may operate according to three modes.

When the memory cell array is configured with four banks, the data comparator 362_2 may output a signal indicating whether data of each of the banks BANK0 to BANK3 are the same as one another.

When the data comparator 362_2 operates in mode 1, Logic-Bus_0 may output a comparison result of bank B0, Logic-Bus_1 may output a comparison result of bank B1, Logic-Bus_2 may output a comparison result of bank B2, and Logic-Bus_3 may output a comparison result of bank B3. Thus, in which bank an error occurs in a data path can be determined through data of the Logic-BUS_0 to 3.

When the data comparator 362_2 operates in mode 2, comparison results of the bank B0 and the bank B1 may be compared through an XOR operation, and comparison results of the bank B2 and the bank B3 may be compared through an XOR operation. Thus, it can be determined in which group including a plurality of banks an error occurs in data paths.

When the data comparator 362_2 is operated in mode 3, comparison results of the banks 0 to 3 may all be operated on as one bit through an XOR operation. The operated result may be output through Logic-Bus_x. When the data comparator 362_2 is operated in mode 3, it can be determined whether an error occurs in data paths of the memory device.

Figure 14:
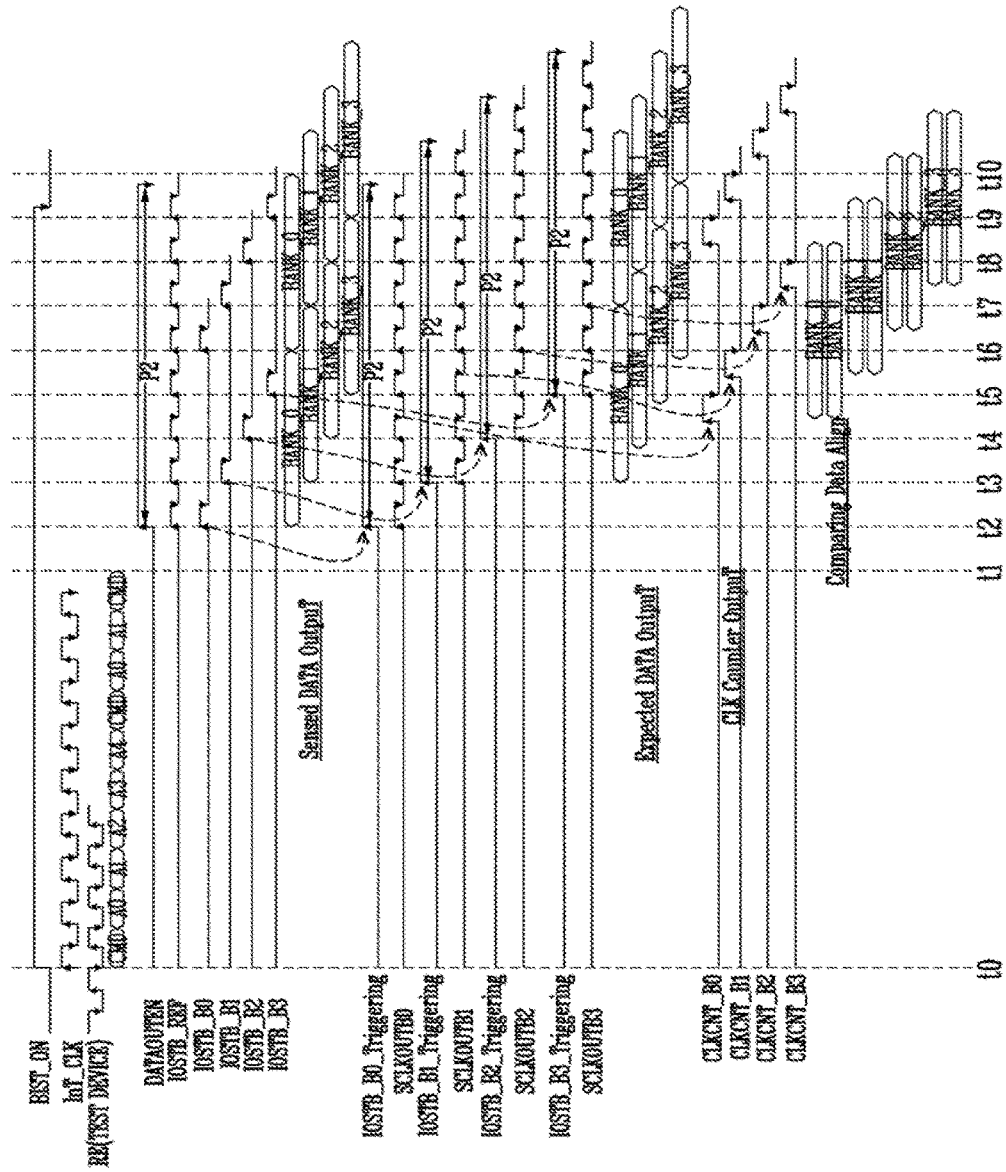
FIG. 14 is a timing diagram illustrating a built-in self-test (BIST) read operation in accordance with an embodiment of the present disclosure.

FIG. 14 is a timing diagram illustrating a BIST read operation according to an embodiment of the present disclosure.

Referring to FIGS. 2, 3, 11, and 14, when the memory device is in a state in which it has performed a BIST write operation before t0, the BIST enable signal BIST_ON keeps being provided, and accordingly, the reference clock INT_CLK also keeps being generated.

At t0, the memory device receives a read enable signal WE indicating that a command CMD and an address ADDR input from the test device 500, correspond to the BIST read operation.

In a section of t0 to t1, the memory device may receive a command CMD and addresses A0 to A4.

At t2, the BIST logic 310 may output a data output enable signal DATAOUTEN to the clock timing controller 330. According to the data output enable signal DATAOUTEN, the clock timing controller 330 may generate the reference clock INT_CLK for a preset time as an output reference signal IOSTB_REF for generating an output control signal IOSTB. Also, the clock timing controller 330 may generate output control signals IOSTB_B0 to IOSTB_B3 for reading data stored in a page buffer circuit PB corresponding to each bank, based on the output reference signal IOSTB_REF. According to the output control signals IOSTB_B0 to IOSTB_B3, data stored in page buffer circuits PB corresponding to the respective banks may be provided as second data DATA2 to the test result output unit 360.

Furthermore, the clock timing controller 330 may generate output sample clocks SCLKOUT0 to SCLKOUT3, based on the output control signals IOSTB_B0 to IOSTB_B3. Unlike the BIST write operation, the clock timing controller 330 generates the output sample clocks SCLKOUT0 to SCLKOUT3 according to the output control signals IOSTB_B0 to IOSTB_B3 instead of the data output enable signal DATAOUTEN, to allow the output time of sensed data to be maximally synchronized with the generation time of reference data.

At t2 to t5, reference data corresponding to each bank may be generated by the pattern data generator 340, based on the output sample clocks SCLKOUT0 to SCLKOUT3, and the reference data may be transmitted as first data DATA1 to the test result output unit 360.

The clock counter 361 of the test result output unit 360 may generate output data alignment signals CLKCNT_B0 to B3 enabled from a time delayed by three periods 3tCK of the output sample clocks SCLKOUT0 to SCLKOUT3 input thereto. The output data alignment signal CLKCNT may have a period corresponding to four periods 4tCK of the output sample clocks SCLKOUT0 to SCLKOUT3, during which data is input/output.

The sensed data and the reference data are synchronized, that is, aligned with each other according to the output data alignment signals CLKCNT_B0 to B3 to be input to the data comparator 362.

The data comparator 362 may compare the first data DATA1 with the second data DATA2, and output a pass/fail signal P/F to the data input/output buffer 240 described with reference to FIG. 2, based on the result of the comparison. For example, if the sensed data and the reference data are the same as each other, the data comparator 362 may output a pass signal P. If the sensed data and the reference data are not the same as each other, the data comparator 362 may output a fail signal F. A structure and operation of the data comparator 362 has been described in more detail with reference to FIGS. 12 and 13, and therefore, its detailed description will be omitted herein.

Figure 15:
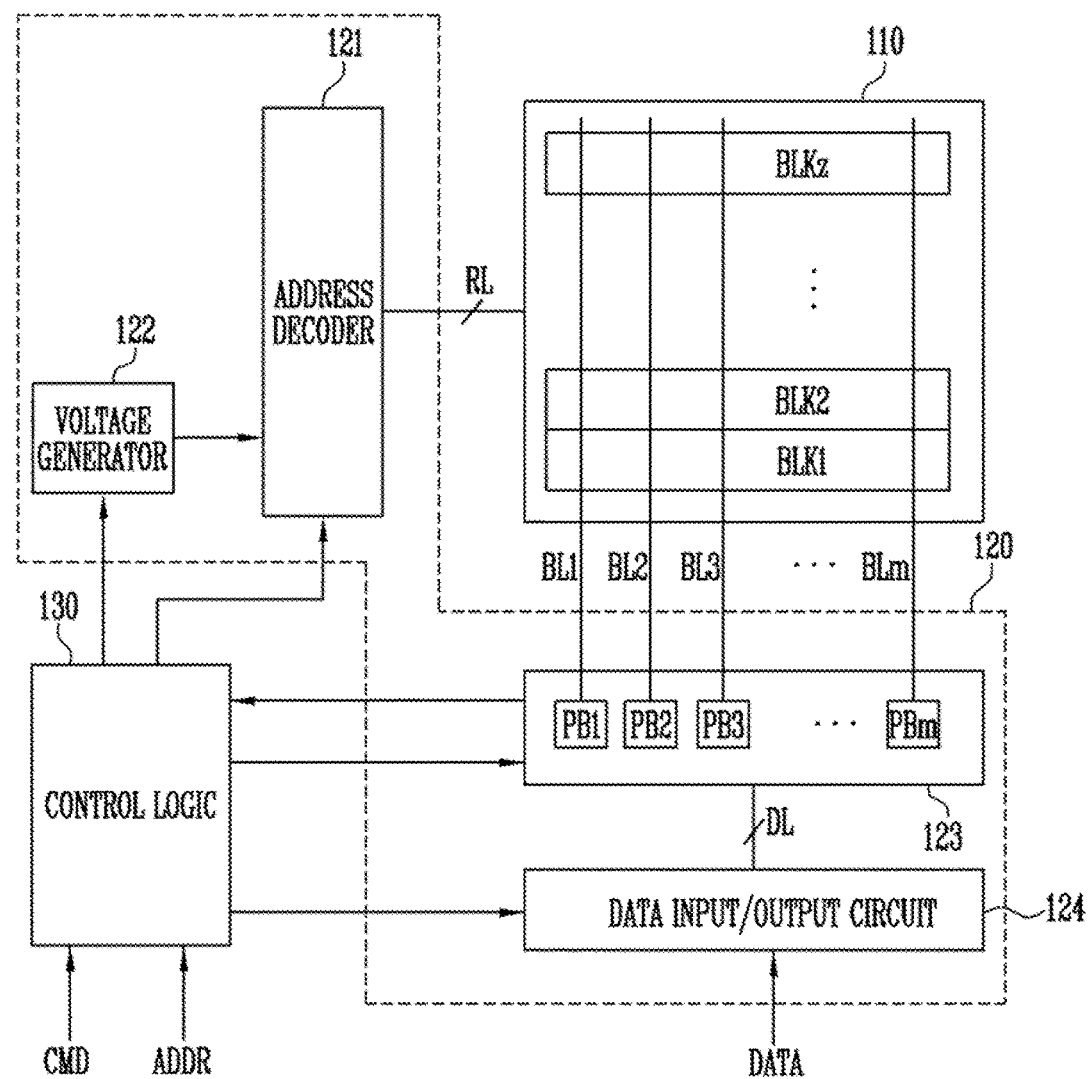
FIG. 15 is a block diagram illustrating another embodiment of the memory device shown in FIG. 1.

FIG. 15 is a block diagram illustrating another embodiment of the memory device of FIG. 1.

In FIG. 15, a configuration and operation of a semiconductor memory device 100 is described. The semiconductor memory device 100 of FIG. 15 is another embodiment of the memory device 200 of FIG. 1.

Referring to FIG. 15, the semiconductor memory device 100 may be a NAND flash memory, a vertical NAND flash memory, a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), or the like. In addition, the semiconductor memory device 100 of the present disclosure may be implemented in a three-dimensional array structure. The present disclosure may be applied to not only a flash memory device in which a charge storage layer is configured with a floating gate (FG) but also a charge trap flash (CTF) in which a charge storage layer is configured with an insulating layer.

The semiconductor memory device 100 operates in response to the control of an external controller (not shown). The semiconductor memory device 100 may receive a command CMD, an address ADDR, and data DATA from the external controller. The semiconductor memory device 100 performs an operation corresponding to the command CMD provided from the external controller. In an embodiment, the command CMD may correspond to any one of program, read, and erase operations.

In a program operation, the semiconductor memory device 100 may receive a program command, an address, and data from the external controller. The semiconductor device 100 may program data in a region selected by the address. In a read operation, the semiconductor memory device 100 may receive a read command and an address from the external controller. The semiconductor memory device 100 may read data from a region selected by the address. In an erase operation, the semiconductor memory device 100 may receive an erase command and an address from the external controller. The semiconductor memory device 100 may erase data stored in a region selected by the address.

Referring to FIG. 15, the semiconductor memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to an address decoder 121 through row lines RL. The plurality of memory blocks BLK1 to BLKz are coupled to a read/write circuit 123 through bit lines BL1 to BLm. Each of the plurality of memory blocks BLK1 to BLKz includes a plurality of memory cells. In an embodiment, the plurality of memory cells are nonvolatile memory cells. Among the plurality of memory cells, memory cells coupled to the same word line are defined as one page. That is, the memory cell array 110 is configured with a plurality of pages. In an embodiment, each of the plurality of memory blocks BLK1 to BLKz included in the memory cell array 110 may include a plurality of dummy cells. One or more dummy cells may be coupled in series between a drain select transistor and memory cells and between a source select transistor and memory cells.

In an embodiment, program and read operations of the semiconductor memory device 100 may be performed in units of pages, and an erase operation of the semiconductor memory device 100 may be performed in units of blocks.

Each of the memory cells of the semiconductor memory device 100 may be configured as a single level cell (SLC) for storing one bit of data, a multi-level cell (MLC) for storing two bits of data, a triple level cell (TLC) for storing three bits of data, or a quad level cell (QLC) for storing four bit of data.

The peripheral circuit 120 may include the address decoder 121, a voltage generator 122, the read/write circuit 123, and the data input/output circuit 124.

The peripheral circuit 120 drives the memory cell array 110. For example, the peripheral circuit 120 may drive the memory cell array 120 to perform program, read, and erase operations.

The address decoder 121 is coupled to the memory cell array 110 through the row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 is configured to operate in response to the control of the control logic 130. The address decoder 121 receives an address ADDR from the control logic 130.

The address decoder 121 is configured to decode a block address in the received address ADDR. The address decoder 121 selects at least one memory block among the memory blocks BLK1 to BLKz according to the decoded block address. The address decoder 121 is configured to decode a row address in the received address ADDR. The address decoder 121 may select at least one word line WL of the selected memory block by applying voltages provided from the voltage generator 122 to the word line WL according to the decoded row address.

In a program operation, the address decoder 121 may apply a program voltage to the selected word line, and apply a pass voltage having a level lower than that of the program voltage to unselected word lines. In a program verify operation, the address decoder 121 may apply a verify voltage to the selected word line, and apply a verify pass voltage higher than the verify voltage to the unselected word lines. In a read operation, the address decoder 121 may apply a read voltage to the selected word line, and apply a pass voltage higher than the read voltage to the unselected word lines. In an erase operation, the address ADDR input to the semiconductor device 100 includes a block address. The address decoder 121 may decode the block address and select one memory block according to the decoded block address. In the erase operation, the address decoder 121 may apply a ground voltage to word lines coupled to the selected memory block.

In an embodiment, the address decoder 121 may be configured to decode a column address in the address ADDR transmitted thereto. The decoded column address DCA may be transmitted to the read/write circuit 123. In an exemplary embodiment, the address decoder 121 may include components such as a row decoder, a column decoder, and an address buffer. The address decoder 121 of FIG. 16 may perform operations of the address counter 250 and the column decoder 270 of FIG. 2.

The voltage generator 122 is configured to generate a plurality of voltages by using an external power voltage supplied to the semiconductor memory device 100. The voltage generator 122 operates in response to the control of the control logic 130.

In an embodiment, the voltage generator 122 may generate an internal power voltage by regulating the external power voltage. The internal power voltage generated by the voltage generator 122 is used as an operating voltage of the semiconductor memory device 100.

In an embodiment, the voltage generator 122 may generate a plurality of voltages by using the external power voltage or the internal power voltage. The voltage generator 122 may be configured to generate various voltages required by the semiconductor memory device 100. For example, the voltage generator 122 may generate a plurality of program voltages, a plurality of pass voltages, a plurality of select read voltages, and a plurality of unselect read voltages.

For example, the voltage generator 122 may include a plurality of pumping capacitors for receiving the internal power voltage, and generate a plurality of voltages by selectively activating the plurality of pumping capacitors in response to the control of the control logic 130.

The plurality of generated voltages may be supplied to the memory cell array 110 by the address decoder 121.

The read/write circuit 123 includes first to mth page buffers PB1 to PBm. The first to mth page buffers PB1 to PBm are coupled to the memory cell array 110 through the respective first to mth bit lines BL1 to BLm. The first to mth page buffers PB1 to PBm operate in response to the control of the control logic 130.

The first to mth page buffers PB1 to PBm communicate data with the data input/output circuit 124. In a program operation, the first to mth page buffers PB1 to PBm receive data DATA to be stored through the data input/output circuit 124 and data lines DL.

The data input/output circuit 124 may perform a function of the input/output control circuit 260 of FIG. 2, and the read/write circuit 123 may perform a function of the page buffer group 280 of FIG. 2.

In a program operation, the first to mth page buffers PB1 to PBm may transmit, to selected memory cells, the data DATA to be stored, which is received through the data input/output circuit 124, when a program pulse is applied to a selected word line. The memory cells of the selected page may be programmed according to the transmitted data DATA. A memory cell coupled to a bit line to which a program permission voltage for example, a ground voltage, is applied may have an increased threshold voltage. The threshold voltage of a memory cell coupled to a bit line to which a program prohibition voltage for example, a power voltage, is applied may be maintained. In a program verify operation, the first to mth page buffers PB1 to PBm read page data from the selected memory cells through the bit lines BL1 to BLm.

In a read operation, the read/write circuit 123 reads data DATA from memory cells of a selected page through the bit lines BL, and outputs the read data DATA to the data input/output circuit 124.

The data input/output circuit 124 is coupled to the first to mth page buffers PB1 to PBm through the data lines DL. The data input/output circuit 124 operates in response to the control of the control logic 130.

In an embodiment, the read/write circuit 123 may include a column select circuit.

The data input/output circuit 124 may include a plurality of input/output buffers (not shown) that receive input data. In a program operation, the data input/output circuit 124 may receive data DATA to be stored from an external controller (not shown). In a read operation, the data input/output circuit 124 outputs, to the external controller, data transmitted from the first to mth page buffers PB1 to PBm, included in the read/write circuit 123.

The control logic 130 may be coupled to the address decoder 121, the voltage generator 122, the read/write circuit 123, and the data input/output circuit 124. The control logic 130 may be configured to control overall operations of the semiconductor memory device 100. The control logic 130 may operate in response to a command CMD transmitted from an external device.

Figure 16:
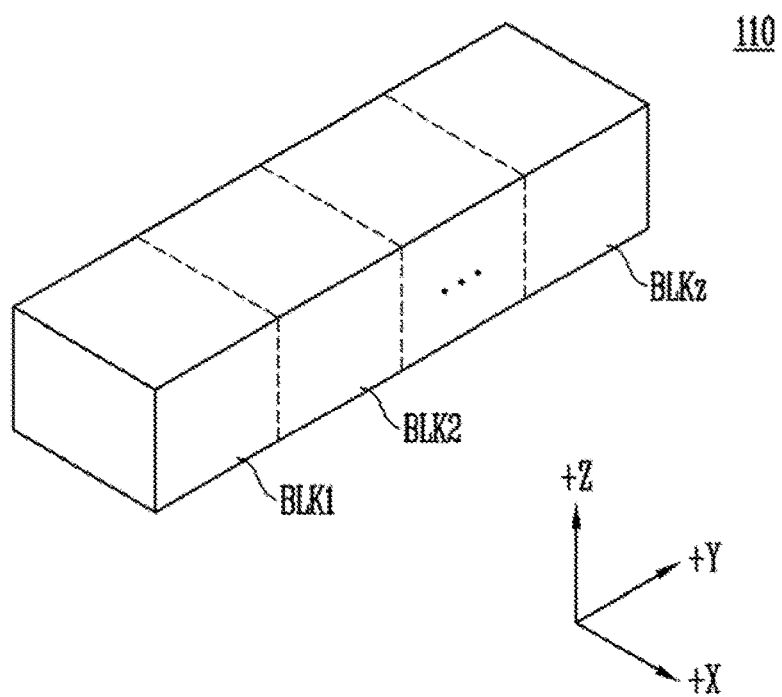
FIG. 16 is a diagram illustrating an embodiment of a memory cell array shown in FIG. 15.

FIG. 16 is a diagram illustrating an embodiment of the memory cell array of FIG. 15.

Referring to FIG. 16, the memory cell array 110 includes a plurality of memory blocks BLK1 to BLKz. Each memory block may have a three-dimensional structure. Each memory block includes a plurality of memory cells stacked on a substrate. The plurality of memory cells are arranged along +X, +Y, and +Z directions. A structure of each memory block will be described in more detail with reference to FIGS. 17 and 18.

Figure 17:
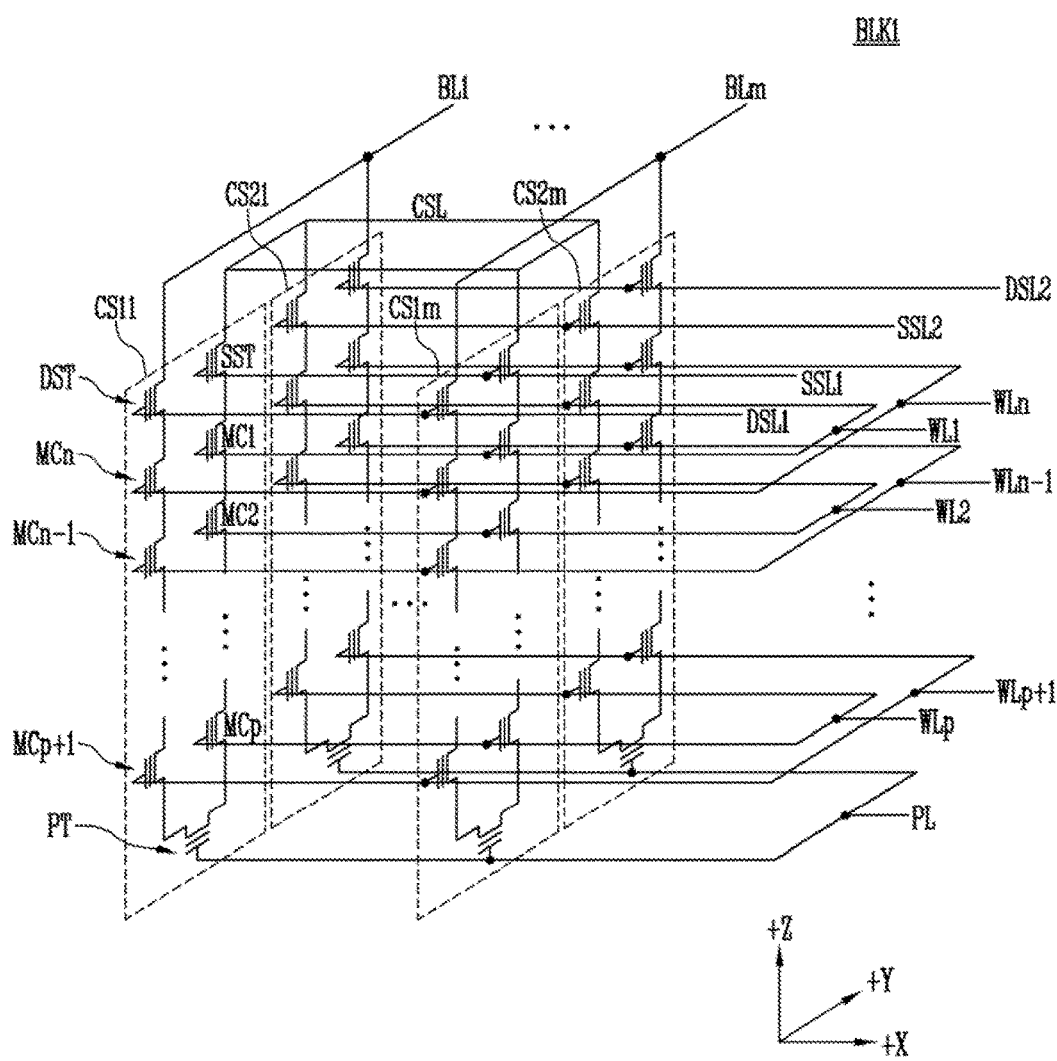
FIG. 17 is a circuit diagram illustrating one of memory blocks shown in FIG. 16.

FIG. 17 is a circuit diagram illustrating one BLK1 of the memory blocks BLK1 to BLKz of FIG. 16.

Referring to FIG. 17, a first memory block BLK1 includes a plurality of cell strings CS11 to CS1m and CS21 to CS2m. In an embodiment, each of the plurality of cell strings CS11 to CS1m and CS21 to CS2m may be formed in a 'U' shape. In the first memory block BLK1, m cell strings are arranged in a row direction that is, a +X direction. In FIG. 17, it is illustrated that two cell strings are arranged in a column direction that is, a +Y direction. However, this is for convenience of description, and it will be understood that three cell strings may be arranged in the column direction.

Each of the plurality of cell strings CS11 to CS1m and CS21 to CS2m includes at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 17, the source select transistors of the cell strings CS11 to CS1m on a first row are coupled to a first source select line SSL1. The source select transistors of the cell strings CS21 to CS2m on a second row are coupled to a second source select line SSL2.

In another embodiment, the source select transistors of the cell strings CS11 to CS1m and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 17, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be coupled to the even bit lines, respectively, and odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. As a larger number of dummy memory cells are provided, the reliability of an operation of the memory block BLK1 is improved, however, the size of the memory block BLK1 is increased. As a smaller number of dummy memory cells are provided, the size of the memory block BLK1 is decreased, however, the reliability of an operation of the memory block BLK1 may be deteriorated.

To efficiently control the at least one dummy memory cell, the dummy memory cells may have a required threshold voltage. Before or after an erase operation of the memory block BLK1, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 18:
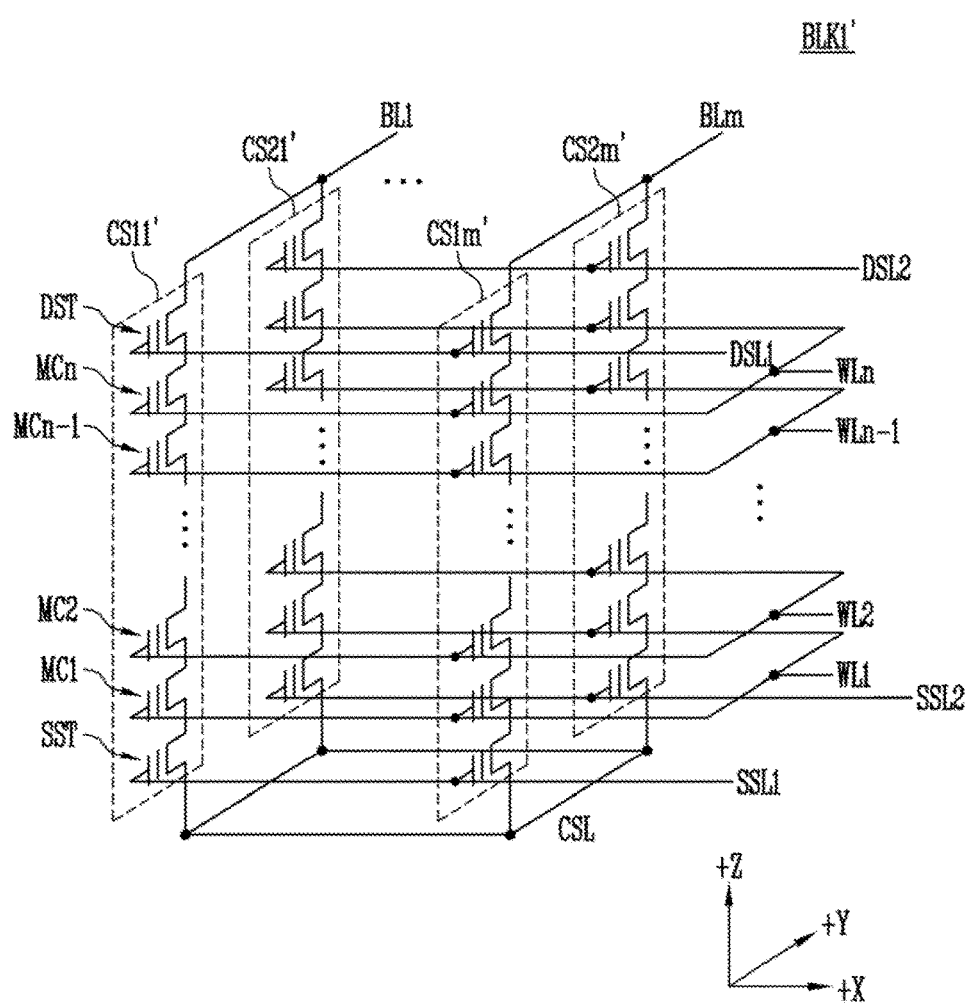
FIG. 18 is a circuit diagram illustrating another embodiment of the one of the memory blocks shown in FIG. 16.

FIG. 18 is a circuit diagram illustrating another embodiment BLK1' of the one BLK1 of the memory blocks BLK1 to BLKz of FIG. 16.

Referring to FIG. 18, a first memory block BLK1' includes a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLK1'.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLK1' of FIG. 18 has an equivalent circuit similar to that of the memory block BLK1 of FIG. 17, except that the pipe transistor PT is excluded from each cell string.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. As a larger number of dummy memory cells are provided, the reliability of an operation of the memory block BLK1' is improved however, the size of the memory block BLK1' is increased. As a smaller number of dummy memory cells are provided, the size of the memory block BLK1' is decreased however, the reliability of an operation of the memory block BLK1' may be deteriorated.

To efficiently control the at least one dummy memory cell, the dummy memory cells may have a required threshold voltage. Before or after an erase operation of the memory block BLK1', a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 19:
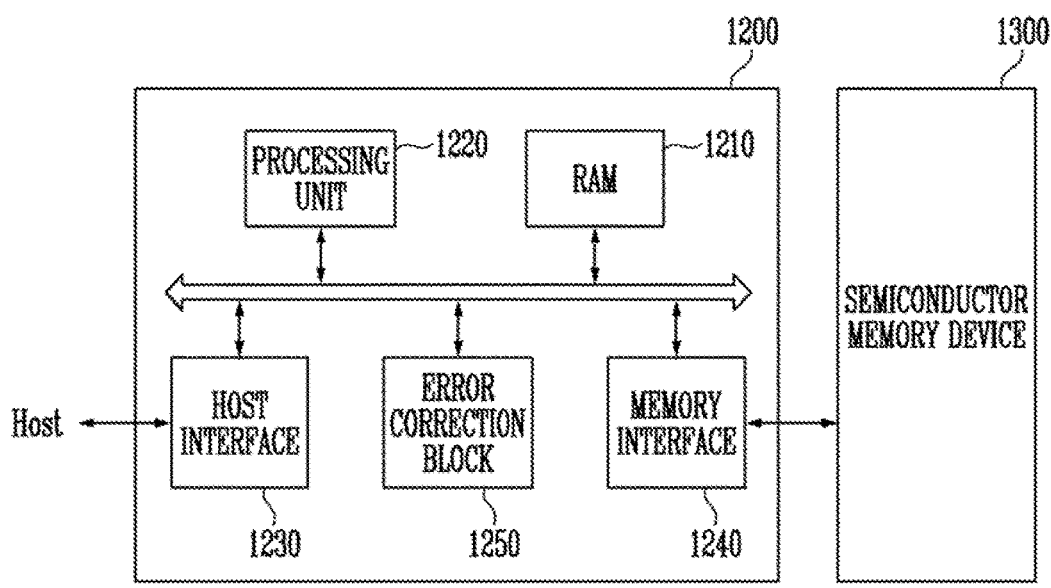
FIG. 19 is a block diagram illustrating a storage device including a memory device according to an embodiment of the present disclosure.

FIG. 19 is a block diagram illustrating a storage device including a memory device according to an embodiment of the present disclosure.

Referring to FIG. 19, the storage device 1000 includes a semiconductor memory device 1300 and a controller 1200.

The semiconductor memory device 1300 may be configured and operated identically to the semiconductor memory device 100 described with reference to FIG. 1. Hereinafter, overlapping descriptions will be omitted.

The controller 1200 is coupled to a host Host and the semiconductor memory device 1300. The controller 1200 is configured to access the semiconductor memory device 1300 in response to a request from the host Host. For example, the controller 1200 is configured to control read, write, erase, and background operations of the semiconductor memory device 1300. The controller 1200 is configured to provide an interface between the semiconductor memory device 1300 and the host Host. The controller 1200 is configured to drive firmware for controlling the semiconductor memory device 1300.

The controller 1200 includes a random access memory (RAM) 1210, a processing unit 1220, a host interface 1230, a memory interface 1240, and an error correction block 1250.

The RAM 1210 is used as at least one of an operation memory of the processing unit 1220, a cache memory between the semiconductor memory device 1300 and the host Host, and a buffer memory between the semiconductor memory device 1300 and the host Host.

The processing unit 1220 controls overall operations of the controller 1200. The processing unit 1220 is configured to control read, program, erase, and background operations of the semiconductor memory device 1300. The processing unit 1220 is configured to drive firmware for controlling the semiconductor memory device 1300. The processing unit 1220 may perform a function of a flash translation layer (FTL). The processing unit 1220 may convert a logical block address (LBA) provided by the host into a PBA through the FTL. The FTL may receive an LBA using a mapping table, to convert the LBA into a PBA. There are various address mapping methods of the FTL according to mapping units. Representative address mapping methods include a page mapping method, a block mapping method, and a hybrid mapping method.

The processing unit 1220 is configured to randomize data provided from the host Host. For example, the processing unit 1220 may randomize the data provided from the host Host by using a randomizing seed. The randomized data is provided as data to be stored to the semiconductor memory device 1300, to be programmed in a memory cell array.

The processing unit 1220 is configured to de-randomize data provided from the semiconductor memory device 1300 when a read operation is performed. For example, the processing unit 1220 may de-randomize the data provided from the semiconductor memory device 1300 by using a de-randomizing seed. The de-randomized data may be output to the host Host.

In an embodiment, the processing unit 1220 may perform randomizing and de-randomizing by driving software or firmware.

The host interface 1230 includes a protocol for exchanging data between the host Host and the controller 1200. In an embodiment, the controller 1200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1240 interfaces with the semiconductor memory device 1300. For example, the memory interface 1240 may include a NAND interface or a NOR interface.

The error correction block 1250 is configured to detect and correct an error of data provided from the semiconductor memory device 1300 by using an error correction code (ECC). The error correction block 1250 may correct an error with respect to read page data by using the ECC. The error correction block 1250 may correct an error by using coded modulation including low density parity check (LDPC) code, Bose, Chaudhuri, and Hocquenghem (BCH) code, turbo code, Reed-Solomon code, convolution code, recursive systematic code (RSC), trellis-coded modulation (TCM), block coded modulation, Hamming code, etc.

The controller 1200 and the semiconductor memory device 1300 may be integrated into one semiconductor device. In an exemplary embodiment, the controller 1200 and the semiconductor memory device 1300 may be integrated into one semiconductor device, to constitute a memory card. For example, the controller 1200 and the semiconductor memory device 1300 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1200 and the semiconductor memory device 1300 may be integrated into one semiconductor device to constitute a semiconductor drive (solid state drive (SSD)). The semiconductor drive SSD includes a storage device configured to store data in a semiconductor memory. If the storage device 1000 is used as the semiconductor drive SSD, the operating speed of the host Host coupled to the storage device 1000 can be remarkably improved.

As another example, the storage device 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an exemplary embodiment, the semiconductor memory device 1300 or the storage device 1000 may be packaged in various forms. For example, the semiconductor memory device 1300 or the storage device 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi-chip package (MCP), wafer-level fabricated package (WFP), or wafer-level processed stack package (WSP).

Figure 20:
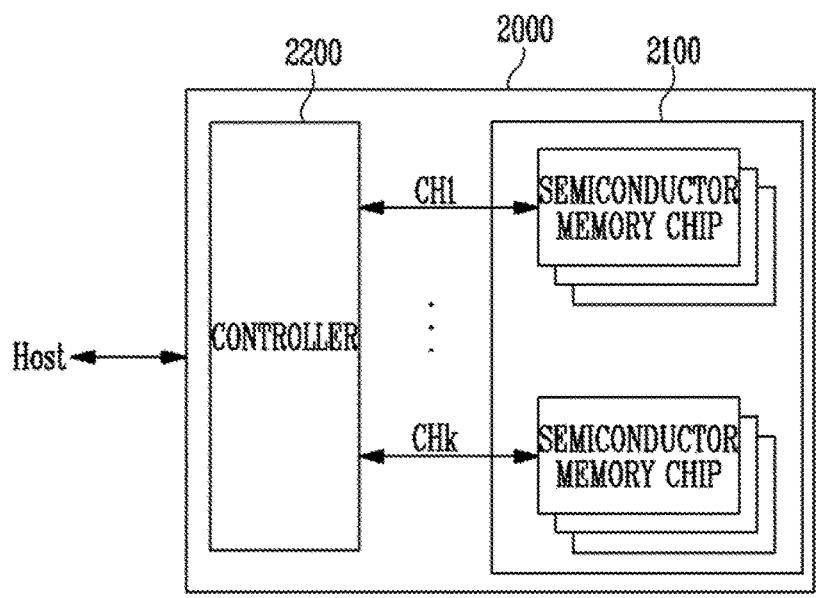
FIG. 20 is a block diagram illustrating an application example of the storage device shown in FIG. 19.

FIG. 20 is a block diagram illustrating an application example 2000 of the storage device of FIG. 19.

Referring to FIG. 20, the storage device 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 20, it is illustrated that the plurality of groups communicate with the controller 2200 through first to kth channels CH1 to CHk. Each semiconductor memory chip may be configured and operated identically to the semiconductor memory device 100 described with reference to FIG. 1.

Each group is configured to communicate with the controller 2200 through one common channel. The controller 2200 is configured similarly to the controller 1200 described with reference to FIG. 19. The controller 2200 is configured to control the plurality of memory chips of the semiconductor memory device 2100 through the plurality of channels CH1 to CHk.

In FIG. 20, it has been illustrated that a plurality of semiconductor memory chips are coupled to one channel. However, it will be understood that the storage device 2000 may be modified such that one semiconductor memory chip is coupled to one channel.

Figure 21:
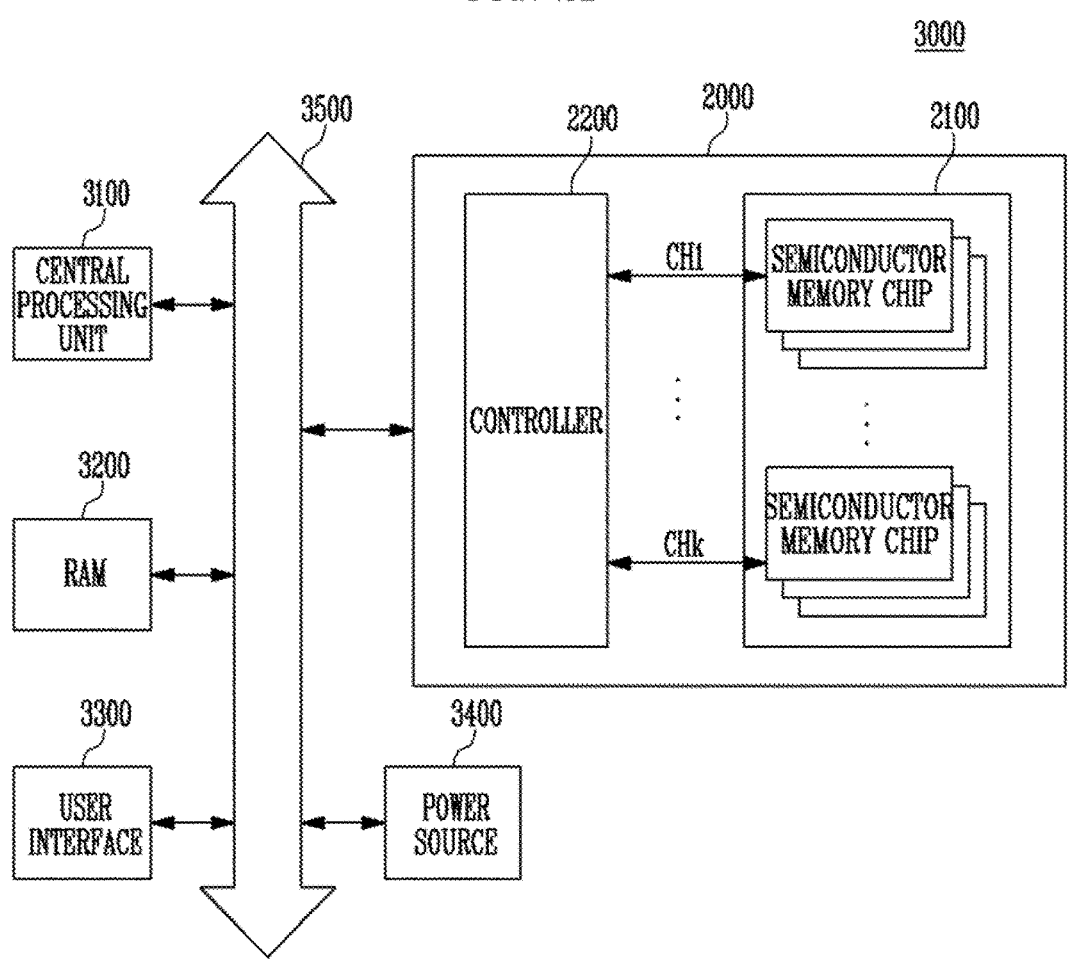
FIG. 21 is a block diagram illustrating a computing system including the storage device described with reference shown in FIG. 20.

FIG. 21 is a block diagram illustrating a computing system including the storage device 2000 described with reference to FIG. 20.

Referring to FIG. 21, the computing system 3000 includes a central processing unit 3100, a RAM 3200, a user interface 3300, a power source 3400, a system bus 3500, and the storage device 2000.

The storage device 2000 is electrically coupled to the central processing unit 3100, the RAM 3200, the user interface 3300, and the power source 3400 through the system bus 3500. Data supplied through user interface 3300 or data processed by the central processing unit 3100 are stored in the storage device 2000.

In FIG. 21, it is illustrated that the semiconductor memory device 2100 is coupled to the system bus 3500 through the controller 2200. However, the semiconductor memory device 2100 may be directly coupled to the system bus 3500. In this case, the function of the controller 2200 may be performed by the central processing unit 3100 and the RAM 3200.

In FIG. 21, it is illustrated that the storage device 2000 described with reference to FIG. 20 is provided. However, the storage device 2000 may be replaced by the storage device 1000 described with reference to FIG. 19. In an embodiment, the computing system 3000 may be configured to include both the storage devices 1000 and 2000 described with reference to FIGS. 19 and 20.

According to the present disclosure, it is possible to provide a memory device that supports a built-in self-test operation and an operating method for the memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device comprising:
    a plurality of memory cells;
    a page buffer group including page buffer circuits respectively coupled to the plurality of memory cells through bit lines;
    a built-in self-test (BIST) controller configured to generate pattern data to be stored in the page buffer circuits and to be compared with sensed data obtained from the page buffer circuits, and to compare the pattern data with the sensed data; and
    an input/output control circuit configured to input the pattern data to the page buffer circuits and to transfer the sensed data from the page buffer circuits to the BIST controller,
    wherein the BIST controller includes:
    a reference clock generator configured to generate a reference clock having a preset target frequency;
    a BIST logic configured to, in response to a BIST enable signal input from an external test device, generate a data input enable signal in a BIST write operation and generate a data output enable signal in a BIST read operation;
    a clock timing controller configured to generate an input sample clock by using the data input enable signal and the reference clock in the BIST write operation; and a pattern data generator configured to generate the pattern data according to the input sample clock.

2. The memory device of claim 1, wherein the pattern data generator includes:
a seed data generator configured to generate seed data by using a seed value that is sequentially increased; and
a data extension unit configured to generate the pattern data by using the seed data and an inverse seed data obtained by inverting the seed data.

3. The memory device of claim 2, wherein the seed value is repeatedly increased sequentially from 0 to 15 according to an input sample signal, and
the pattern data is formed by repeating data having an arbitrary pattern as the seed value is increased.

4. The memory device of claim 1, wherein the clock timing controller generates an input data alignment signal that is a timing signal for providing the pattern data to the input/output control circuit.

5. The memory device of claim 1, wherein, in the BIST read operation, the clock timing controller generates an output control signal for sensing data from the page buffer circuits by using the data output enable signal and the reference clock, and
the input/output control circuit obtains the sensed data from the page buffer circuits according to the output control signal.

6. The memory device of claim 5, wherein the clock timing controller generates an output sample clock that is a timing signal for generating the pattern data by using the output control signal and the reference clock, and
the pattern data generator generates the pattern data according to the output sample clock.

7. The memory device of claim 6, wherein the BIST controller further includes a test result output unit configured to compare the sensed data and the pattern data, and output a pass signal or a fail signal based on the result of the comparison.

8. The memory device of claim 7, wherein the test result output unit includes:
a clock counter configured to generate an output data alignment signal that is a timing signal for allowing the sensed data and the pattern data to be synchronized with each other; and
a data comparator configured to compare the sensed data and the pattern data, which are aligned according to the output data alignment signal.

9. The memory device of claim 8, wherein the output data alignment signal is a timing signal that allows the output sample clock to be delayed by any one of two periods or three periods of the output sample clock.

10. The memory device of claim 8, wherein the data comparator compares the sensed data and the pattern data on a bitwise basis.

11. The memory device of claim 8, wherein the data comparator performs an exclusive OR (XOR) operation on the sensed data and the pattern data in units of bits.

12. The memory device of claim 8, wherein the data comparator outputs the pass signal if the sensed data and the pattern data are the same as each other, and outputs the fail signal if the sensed data and the pattern data are not the same as each other.

13. A memory device having a memory cell array including a plurality of memory banks, the memory device comprising:

a page buffer group including a plurality of page buffer circuits respectively coupled to the plurality of memory banks, the plurality of page buffer circuits storing data to be stored in the plurality of memory banks and storing data read from the plurality of memory banks; and
a BIST controller configured to test a data path of the memory device by performing a BIST write operation of storing pattern data in the plurality of page buffer circuits and performing a BIST read operation of reading data stored in the page buffer circuits,
wherein the BIST controller includes:
a reference clock generator configured to generate a reference clock having a preset target frequency;
a BIST logic configured to, in response to a BIST enable signal input from an external test device, generate a data input enable signal in the BIST write operation and generate a data output enable signal in the BIST read operation;
a clock timing controller configured to generate an input sample clock by using the data input enable signal and the reference clock in the BIST write operation; and
a pattern data generator configured to generate the pattern data according to the input sample clock.

14. A method for operating a memory device, the method comprising:
receiving a write command and a write address from an external device;
generating pattern data to be stored in a page buffer circuit corresponding to the write address in response to the write command;
storing the pattern data in the page buffer circuit corresponding to the write address;
receiving a read command and a read address from the external device;
generating the pattern data in response to the read command; and
comparing the pattern data with sensed data obtained from the page buffer circuit,
wherein the generating the pattern data includes:
generating a reference clock having a preset target frequency;
in response to a BIST enable signal input from an external test device, generating a data input enable signal in a BIST write operation and generate a data output enable signal in a BIST read operation;
generating an input sample clock by using the data input enable signal and the reference clock in the BIST write operation; and
generating the pattern data according to the input sample clock.

15. The method of claim 14, wherein the generating the pattern data further comprises:
generating seed data by using a seed value that is sequentially increased; and
generating the pattern data by using the seed data and an inverse seed data obtained by inverting the seed data.

16. The method of claim 15,
wherein the seed value is repeatedly increased sequentially from 0 to 15 according to an input sample signal, and
the pattern data is formed by repeating data having an arbitrary pattern as the seed value is increased.

* * * * *